US010373890B1

(12) United States Patent
Hoegerl et al.

(10) Patent No.: US 10,373,890 B1
(45) Date of Patent: Aug. 6, 2019

(54) COOLING TECHNIQUES FOR SEMICONDUCTOR PACKAGE

(71) Applicant: Infineon Technologies AG, Neubiberg (DE)

(72) Inventors: Juergen Hoegerl, Regensburg (DE); Andreas Grassmann, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/948,747

(22) Filed: Apr. 9, 2018

(51) Int. Cl.
*H01L 23/31* (2006.01)
*H01L 23/373* (2006.01)
*H01L 23/473* (2006.01)
*H01L 23/367* (2006.01)
*H01L 23/495* (2006.01)
*H02M 1/08* (2006.01)

(52) U.S. Cl.
CPC ........ *H01L 23/367* (2013.01); *H01L 23/3107* (2013.01); *H01L 23/3135* (2013.01); *H01L 23/3737* (2013.01); *H01L 23/473* (2013.01); *H01L 23/4952* (2013.01); *H01L 23/49562* (2013.01); *H02M 1/08* (2013.01)

(58) Field of Classification Search
CPC . H01L 23/293; H01L 23/295; H01L 23/3135; H01L 23/3192; H01L 23/3737; H01L 23/473; H01L 23/49562; H01L 23/49575
See application file for complete search history.

(56) References Cited

U.S. PATENT DOCUMENTS 4,924,351 A * 5/1990 Kato ........................ H01L 23/24 174/548
4,974,057 A * 11/1990 Tazima ............... H01L 23/3135 174/536
8,804,340 B2 8/2014 Hauenstein
2002/0052105 A1* 5/2002 Akram .................. H01L 21/563 438/613
2004/0201082 A1* 10/2004 Ochiai .................. H01L 23/295 257/666
2006/0096299 A1* 5/2006 Mamitsu ............... H01L 23/473 62/3.2

(Continued)

OTHER PUBLICATIONS

Schmid, et al., "Power Electronic Package for Double Sided Cooling Utilizing Tile-Level Assembly," PCIM Europe, 2017, May 16-18, 2017, 7 pp.

*Primary Examiner* — Bryan R Junge
(74) *Attorney, Agent, or Firm* — Shumaker & Sieffert, P.A.

(57) ABSTRACT

In some examples, a device includes a high-side switch, a first high-side conductive element electrically connected to a first load terminal of the high-side switch, and a second high-side conductive element electrically connected to a second load terminal of the high-side switch. The device also includes a layer of cooling material encapsulating the high-side switch, the first high-side conductive element, and the second high-side conductive element. The device further includes a low-side switch, a first low-side conductive element electrically connected to a first load terminal of the low-side switch, and a second low-side conductive element electrically connected to a second load terminal of the low-side switch. The layer of cooling material encapsulates the low-side switch, the first low-side conductive element, and the second low-side conductive element.

20 Claims, 26 Drawing Sheets

(56) References Cited

U.S. PATENT DOCUMENTS

| | | | | |
|---|---|---|---|---|
| 2008/0203550 | A1* | 8/2008 | Ewe | H01L 23/4334 257/675 |
| 2009/0194855 | A1* | 8/2009 | Liu | H01L 23/49551 257/666 |
| 2009/0302444 | A1* | 12/2009 | Ueda | H01L 21/565 257/675 |
| 2010/0308421 | A1* | 12/2010 | Muto | H01L 25/074 257/401 |
| 2011/0037166 | A1* | 2/2011 | Ikeda | H01L 23/3735 257/712 |
| 2011/0057713 | A1* | 3/2011 | Kawanami | H01L 23/642 327/427 |
| 2011/0242761 | A1* | 10/2011 | Tonomoto | H01L 23/4334 361/702 |
| 2011/0316142 | A1* | 12/2011 | Noritake | H01L 23/051 257/713 |
| 2013/0015495 | A1* | 1/2013 | Hauenstein | H01L 25/071 257/140 |
| 2014/0319673 | A1* | 10/2014 | Zhou | H01L 23/4334 257/712 |

* cited by examiner

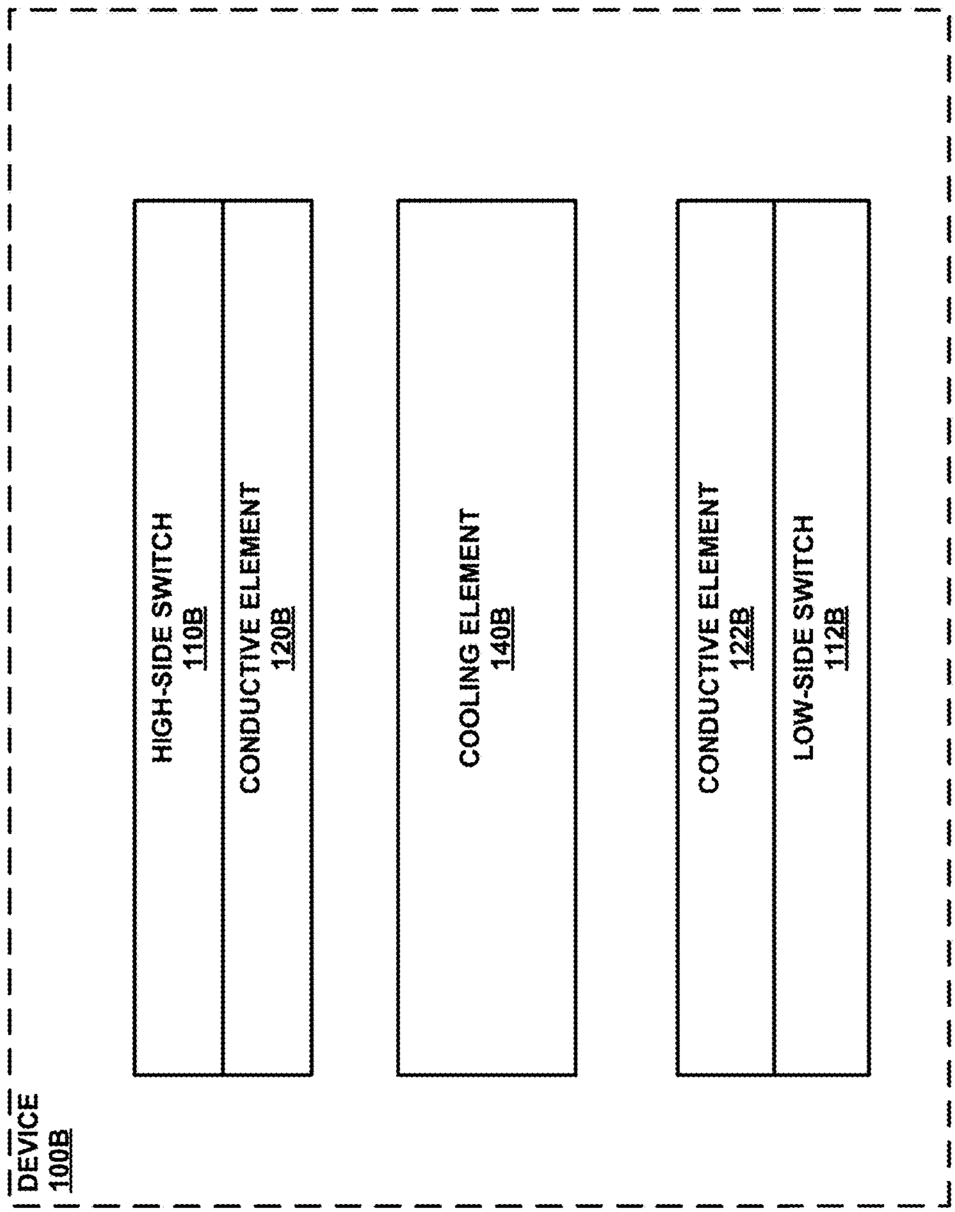
FIG. 1B
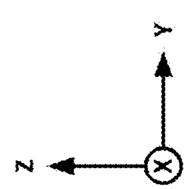

COOLING TECHNIQUES FOR SEMICONDUCTOR PACKAGE

TECHNICAL FIELD

This disclosure relates to semiconductor packaging.

BACKGROUND

A semiconductor device may generate heat during the operation of the device. Heat dissipation from the device may be important to prevent damage to the device, such as expansion or melting of components in the device. Heat dissipation techniques may utilize materials with good thermal conductivity (e.g., metals) that are designed to conduct heat away from the areas that generate heat.

SUMMARY

This disclosure describes direct-cooling techniques and indirect-cooling for dissipating heat in a semiconductor device. A device may include two switches, where each switch is electrically connected to one or more conductive elements. In a direct-cooling example, each switch and the respective conductive elements are surrounded by cooling material that can remove heat generated by the switches. In an indirect-cooling example, the switches and the respective conductive elements are separated by a cooling element. Being positioned between the switches, the cooling element may remove heat that is generated by both switches. In some examples of indirect cooling, the cooling element is configured to carry liquid in order to improve thermal dissipation of heat from the switches. In some examples, a device can include both direct cooling structures and indirect cooling structures.

In some examples, a device includes a high-side switch, a first high-side conductive element electrically connected to a first load terminal of the high-side switch, and a second high-side conductive element electrically connected to a second load terminal of the high-side switch. The device also includes a layer of cooling material encapsulating the high-side switch, the first high-side conductive element, and the second high-side conductive element. The device further includes a low-side switch, a first low-side conductive element electrically connected to a first load terminal of the low-side switch, and a second low-side conductive element electrically connected to a second load terminal of the low-side switch. The layer of cooling material encapsulates the low-side switch, the first low-side conductive element, and the second low-side conductive element.

In some examples, a device includes a cooling element, a high-side switch, and a high-side conductive element electrically connected to a load terminal of the high-side switch, wherein the high-side conductive element is positioned between the high-side switch and the cooling element. The device also includes a low-side switch and a low-side conductive element electrically connected to a load terminal of the low-side switch, wherein the low-side conductive element is positioned between the low-side switch and the cooling element.

In some examples, a method includes electrically connecting a high-side conductive element to a first load terminal of a high-side switch. The method also includes electrically connecting a low-side conductive element to a first load terminal of a low-side switch. The method further includes positioning a cooling element such that the high-side conductive element is positioned between the high-side switch and the cooling element and such that the low-side conductive element is positioned between the low-side switch and the cooling element.

The details of one or more examples are set forth in the accompanying drawings and the description below. Other features, objects, and advantages will be apparent from the description and drawings, and from the claims.

BRIEF DESCRIPTION OF DRAWINGS

FIG. 1B is a conceptual block diagram illustrating a cooling element positioned between two switches, in accordance with some examples of this disclosure.

DETAILED DESCRIPTION

This disclosure describes techniques for dissipating heat generated by switches. A device of this disclosure includes at least two switches, where each switch has a load terminal that is electrically connected to a conductive element. In a direct-cooling approach, each switch and the conductive element(s) attached to the switch are surrounded by cooling material that dissipates heat from the switches and conductive elements. In an indirect-cooling approach, a cooling element is positioned between the switches and respective conductive elements. The approaches may be used together, such that cooling material can surround the cooling element, the switches, and the conductive elements.

A device may include two types of cooling material, where a layer of a first type of cooling material is positioned between conductive elements or between conductive elements and the cooling element(s). A second type of material may be used to surround the first type of cooling material, the switches, the conductive elements, and the cooling element(s). In some examples, the device has a housing covering all of the components and the cooling material(s). The techniques of this disclosure can be extended to multiphase devices that have a segment for each phase. Each segment may include at least one switch, and the cooling material and/or cooling elements may extend through all of the segments of the device.

Each switch may be positioned between two conductive elements, where each conductive element is electrically connected to a load terminal of the switch. In some examples, a first conductive element is configured to receive a power supply, either a high-side or low-side power supply, and a second conductive element is configured to deliver an output signal. The second conductive element may be electrically connected to a conductive element of another switch, for example, to form a switch node of a half-bridge circuit. It is possible to position the output conductive element on the outside (not facing the other switch) or the inside (facing the other switch) of the respective switch. Positioning the output conductive elements (e.g., the switch node or output node) on the outsides of the switches may reduce the impedance and the stray inductance of the device.

Figure 1A:
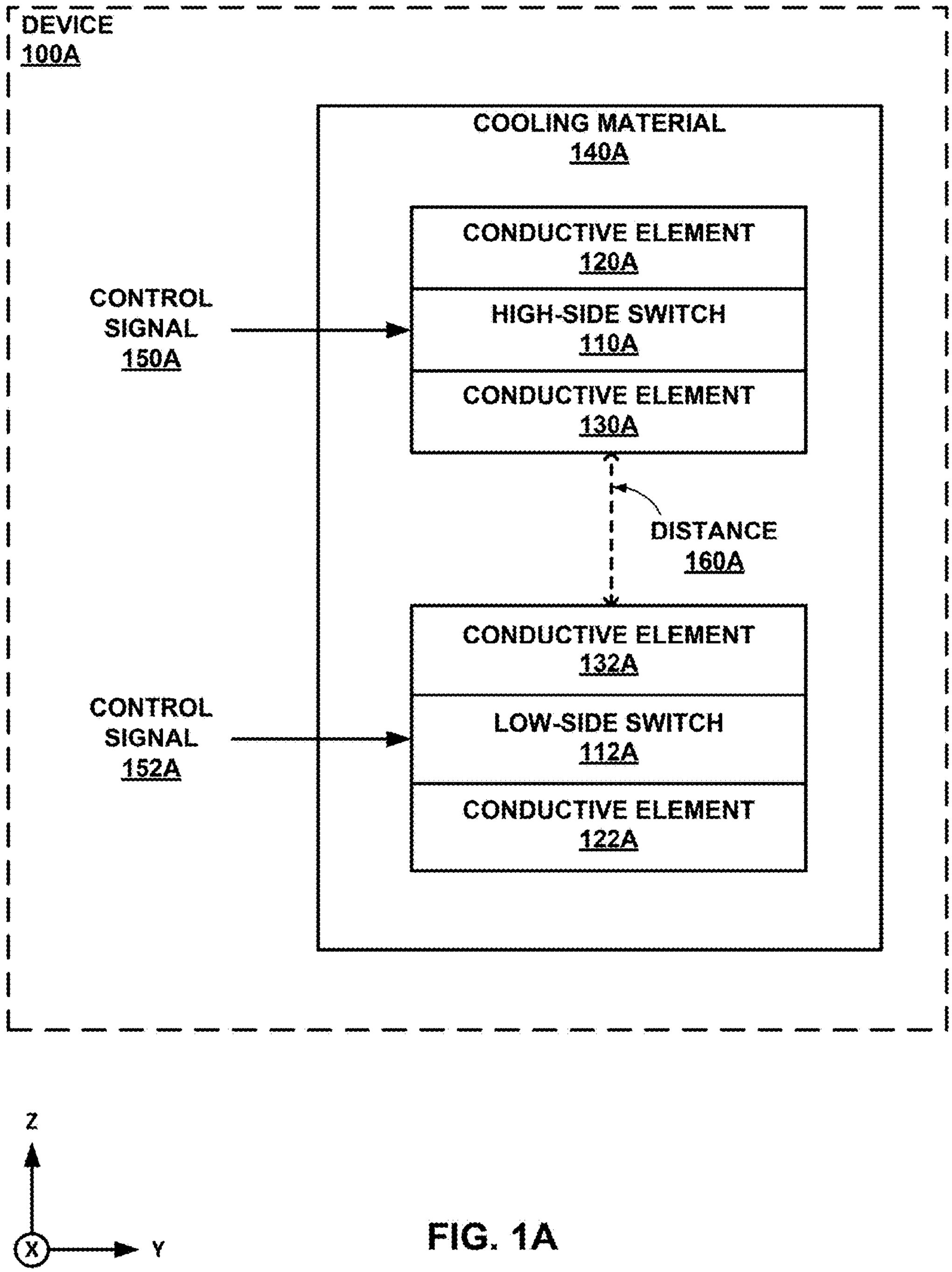
FIG. 1A is a conceptual block diagram illustrating two switches encapsulated by cooling material, in accordance with some examples of this disclosure.

FIG. 1A is a conceptual block diagram illustrating two switches 110A and 112A encapsulated by cooling material 140A, in accordance with some examples of this disclosure. Device 100A includes switches 110A and 112A, conductive elements 120A, 122A, 130A, and 132A, and cooling material 140A. In some examples, device 100A may include a power converter such as a half-bridge direct-current-to-direct-current (DC/DC) buck converter for converting an input DC signal to an output DC signal with a lower voltage. Device 100A may include multiple segments, where each segment operates as a phase of a multiphase power converter. For each phase, a multiphase power converter may include a half-bridge circuit or an H-bridge circuit. In some examples, a half-bridge circuit may include two or more high-side switches electrically connected in parallel and two or more low-side switches electrically connected in parallel to increase the flow of electrical current. As a DC-to-DC buck converter, device 100A may operate as a voltage regulator in a variety of applications. In some examples, device 100A may be designed for high-power applications large amounts of current and high voltages. However, the techniques of this disclosure may apply to other circuits and configurations, such as other power converters, including multiphase power converters and alternating-current-to-DC (AC/DC) power converters.

As shown in FIG. 1A, device 100A may include one or more sub-modules, where each sub-module includes at least two switches and corresponding conductive elements. Each sub-module of device 100A may operate as a phase segment (see FIG. 3). The one or more sub-modules may be standardized, inexpensive to assemble, and relatively easy to test, which gives the opportunity for free scaling. The sub-modules may be assembled side-by-side sitting on top and underneath a C-shaped interconnect element (see, e.g., FIGS. 4B, 4E, and 12). The manufacturer, a production partner, and/or a customer can build a larger device from several sub-modules to achieve higher current-carrying capabilities. For example, one sub-module may carry two hundred amperes, two sub-modules may carry four hundred amperes, and three sub-modules may carry six hundred amperes.

In some examples, device 100A may contain more or fewer components than depicted in FIG. 1. Device 100A may include additional segments of switches and conductive elements, where each segment operates as a phase of a multiphase power converter. Device 100A may include electrical nodes for a high-side power supply, a low-side power supply, and output signal(s). The electrical nodes may be connected to conductive elements 120A, 122A, 130A, and 132A and may be configured to connect to external components. In some examples, two of conductive elements 120A, 122A, 130A, and 132A may operate as power-supply rails (e.g., $V_{DD}$ and $V_{SS}$), and two of conductive elements 120A, 122A, 130A, and 132A as output nodes such as a switch node of a bridge circuit that includes switches 110A and 112A.

Figure 4A:
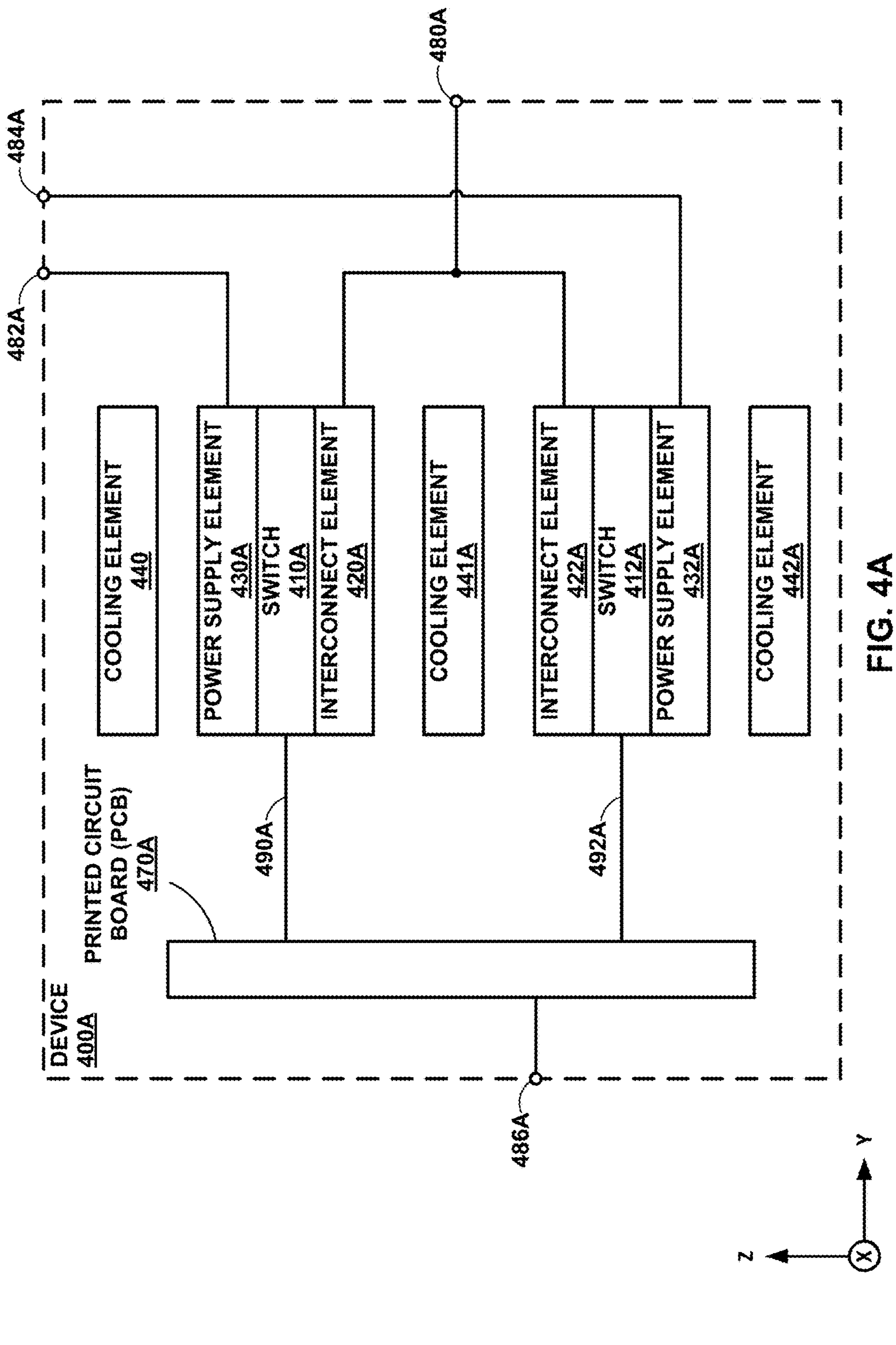
FIG. 4A is a conceptual block diagram illustrating a device including a printed circuit board and four electrical interfaces, in accordance with some examples of this disclosure.
Figure 4B:
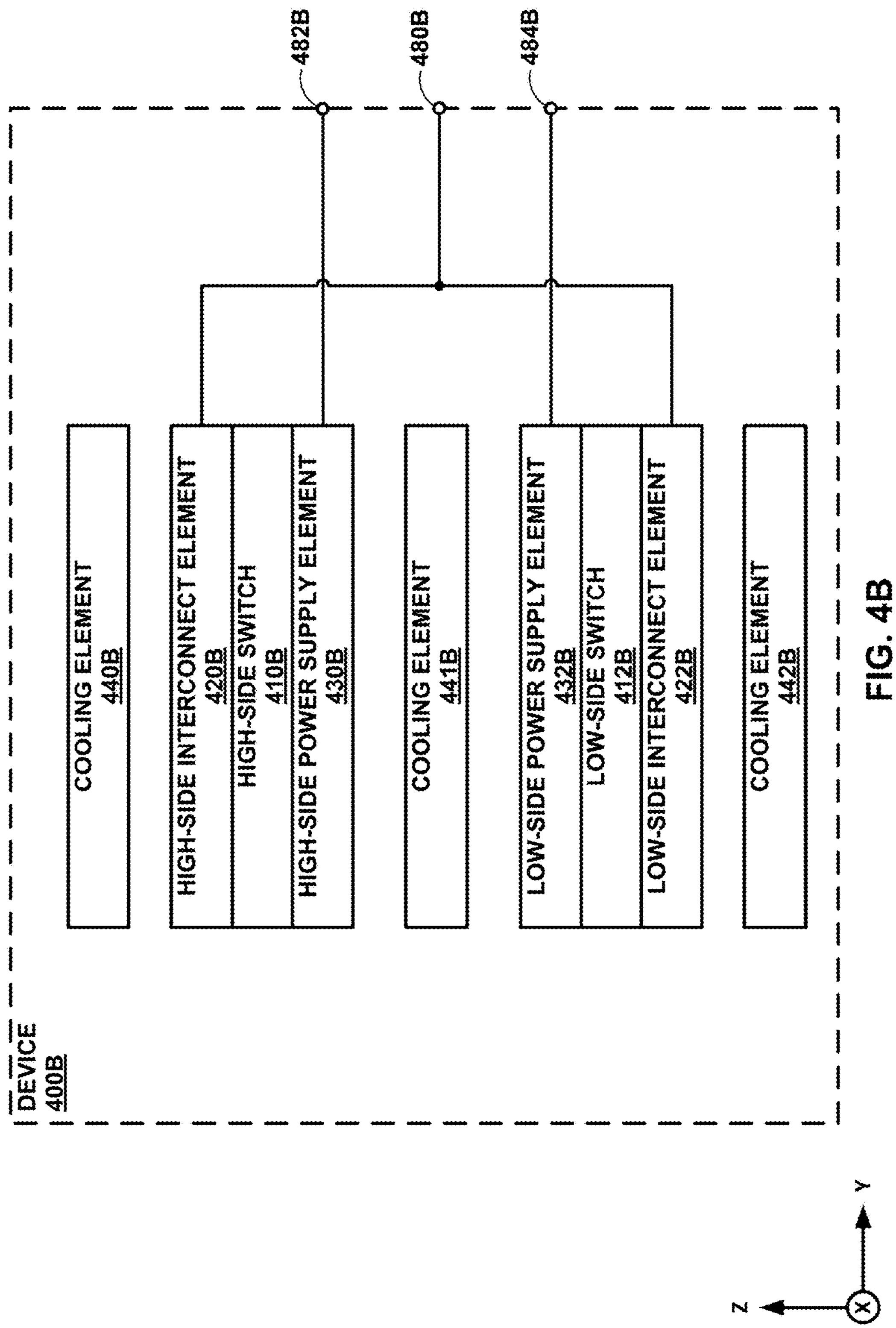
FIG. 4B is a conceptual block diagram illustrating a device including interconnect elements positioned on the outside of two switches, in accordance with some examples of this disclosure.
Figure 4C:
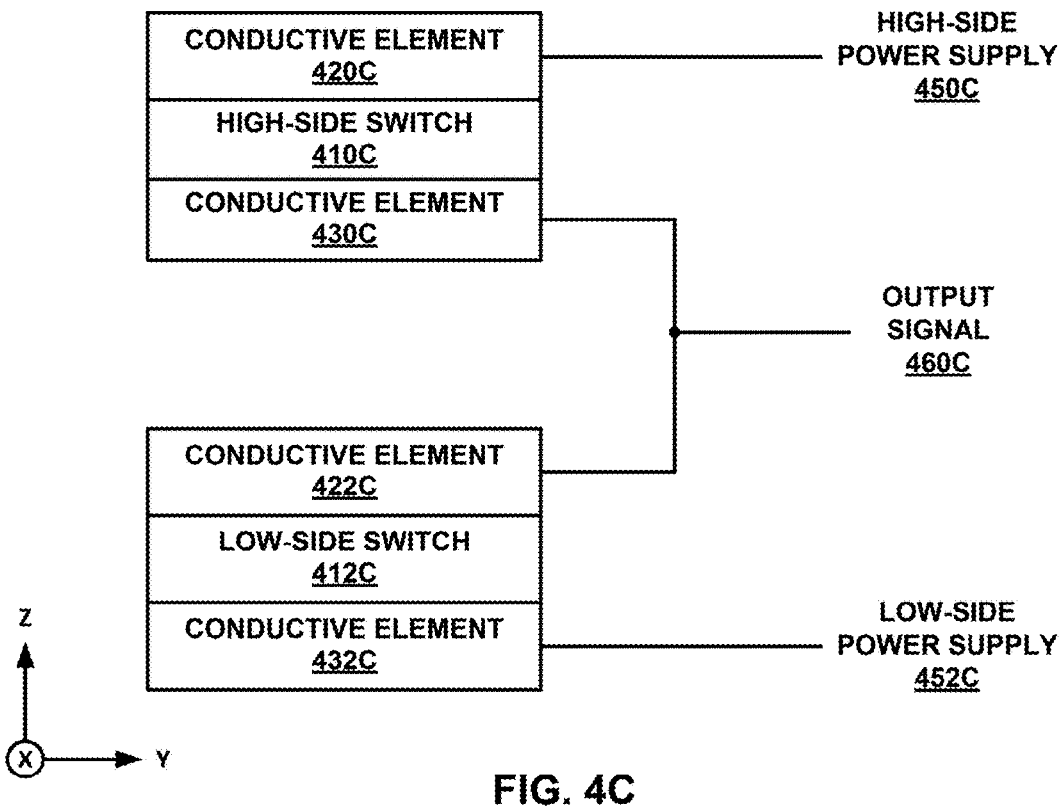
FIGS. 4C and 4E are conceptual block diagrams illustrating C-shaped interconnect elements, in accordance with some examples of this disclosure.
Figure 4D:
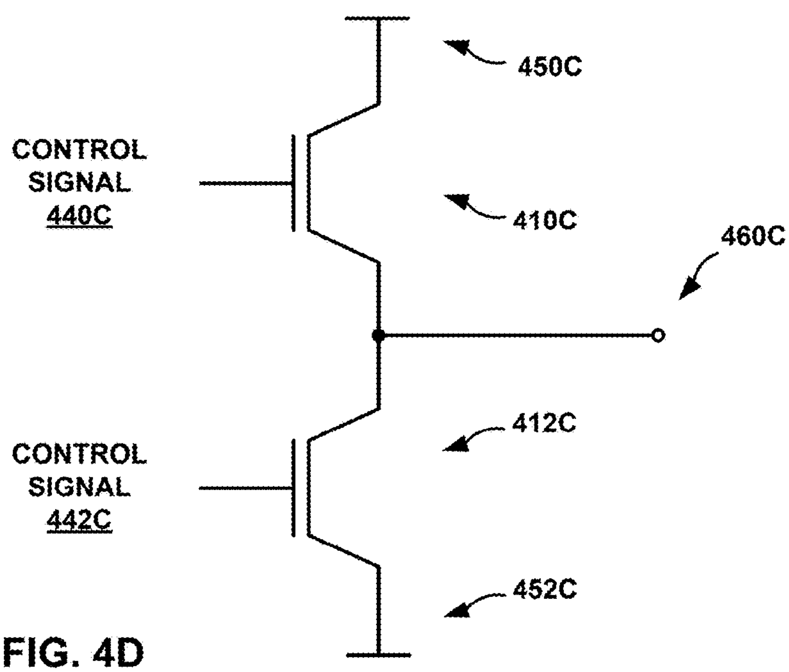
FIG. 4D is a circuit diagram illustrating a half-bridge circuit.
Figure 4E:
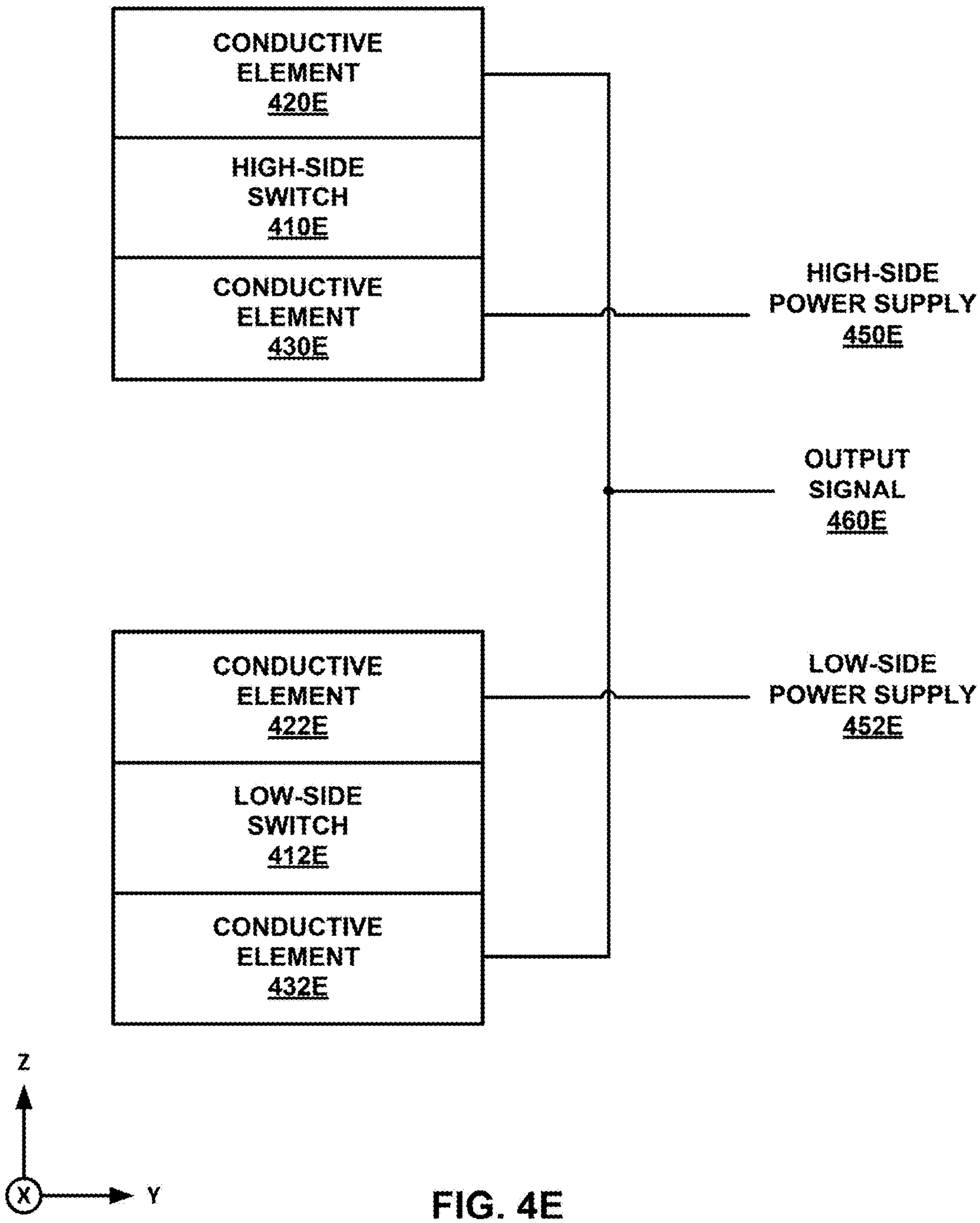

As shown in FIGS. 4A and 4E, outside conductive elements 120A and 122A may operate as power-supply rails, and inside conductive elements 130A and 132A may operate as output nodes. As shown in FIGS. 4B and 4C, outside conductive elements 120A and 122A may operate as an output node, and inside conductive elements 130A and 132A may operate as power-supply rail. By configuring outside conductive elements 120A and 122A as an output node, device 100A may have lower stray inductance, as compared to a device where the inside conductive elements operate as an output node.

Switches 110A and 112A may include metal-oxide semiconductor (MOS) field-effect transistors (FETs), bipolar junction transistors (BJTs), and/or insulated-gate bipolar transistors (IGBTs). Switches 110A and 112A may include n-type transistors or p-type transistors. In some examples, switches 110A and 112A may include other analog devices such as diodes. Switches 110A and 112A may also include freewheeling diodes connected in parallel with transistors to prevent reverse breakdown of switches 110A and 112A. In some examples, switches 110A and 112A may operate as switches, as analog devices, and/or power transistors. Electrical current may flow vertically (the z-axis direction) through switches 110A and 112A between the respective conductive elements based on control signals 150A and 152A.

Switches 110A and 112A may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency switches. These higher frequency circuits may require control signals to be sent with more precise timing than for lower frequency circuits. The switches of FIGS. 1B-15 may have the same or similar properties to switches 110A and 112A.

Conductive elements 120A, 122A, 130A, and 132A may include a metallization layer, a leadframe segment, a clip, a ribbon, a die paddle, a wire bond, and/or any other suitable conductive material. Conductive elements 120A, 122A, 130A, and 132A may include material such as copper, gold, aluminum, solder, and/or any other suitable conductive material. The conductive elements of FIGS. 1B-15 may have the same or similar properties to conductive elements 120A, 122A, 130A, and 132A. A single layer of conductive material of conductive elements 120A, 122A, 130A, and 132A may be three hundred micrometers, and a spacer material (e.g., material 180B and 182B in FIG. 1B) may have approximately the same thickness, for a smaller thickness than a direct bonded copper (DBC) composition. For this reason, in some examples, it may be desirable to avoid the use of DBC compositions and instead use a single layer of conductive material.

Each of conductive elements 120A, 122A, 130A, and 132A may be electrically connected to a respective one of switches 110A and 112A. For example, conductive elements 120A and 130A may be electrically connected to a load terminal of switch 110A and configured to deliver electrical power to and/or receive electrical power from switch 110A. The output node of device 100A may include two of conductive elements 120A, 122A, 130A, and 132A.

Cooling material 140A may partially or fully encapsulate switches 110A and 112A and conductive elements 120A, 122A, 130A, and 132A. Cooling material 140A may be formed around a switch and one or more conductive elements to allow for electrical connections to run from each conductive element to external components such as a power supply or an output terminal. Cooling material 140A may include a plastic material such as thermoplastic material, a mold compound, and/or any other suitable material. Cooling material 140A may be in direct contact with switches 110A and 112A and conductive elements 120A, 122A, 130A, and 132A to absorb and remove heat generated by switches 110A and 112A. Cooling material 140A may also have good electrical isolation properties.

Cooling material 140A may form a layer that surrounds switches 110A and 112A and conductive elements 120A, 122A, 130A, and 132A. Distance 160A between conductive elements 130A and 132A separated by cooling material 140A be less than five hundred micrometers, less than one millimeter, less than two millimeters, or any other suitable distance range. A shorter distance may result in a smaller and less expensive device 100A but may present challenges for electrically isolating conductive elements 130A and 132A.

Switches 110A and 112A may operate based on control signals 150A and 152A. Switches 110A and 112A may be configured to receive control signals 150A and 152A via pins or electrical leads (e.g., signal pins 590 shown in FIG. 5). In some examples, device 100A includes more than one segment, where each segment includes a phase having at least two switches. For example, each of the segments may be configured to operate as a phase in a multiphase power converter. Any of the devices of this disclosure may include multiple segments, where each segment operates as a phase in a multiphase power converter.

FIG. 1B is a conceptual block diagram illustrating a cooling element 140B positioned between two switches 110B and 112B, in accordance with some examples of this disclosure. Conductive element 120B may be positioned between high-side switch 110B and cooling element 140B. Conductive element 122B may be positioned between low-side switch 112B and cooling element 140B. Thus, each of conductive elements 120B and 122B may be configured to conduct heat from a respective one of switches 110B and 112B towards cooling element 140B.

Cooling element 140B may be configured to remove heat from the components of device 100B, such as switches 110B and 112B. Cooling element 140B may include thermally conductive material such as metal, ceramic material, mold compound, and/or fluid. Using fluid, cooling element 140B may provide indirect cooling to switches 110B and 112B. Cooling element 140B may be electrically isolated from switches 110B and 112B and conductive elements 120B and 122B to prevent cooling element 140B from interfering with the operation of device 100B. Cooling element 140B may include a fluid-cooling element configured to carry fluid such as a liquid water, a mixture of water and glycol, carbon dioxide, or another refrigerant. The fluid may receive heat from the components of device 100B and then carry the heat away from the components of device 100B and out of device 100B.

During the operation of device 100B, switches 110B and 112B may generate heat. Heat from switches 110B and 112B may cause thermal expansion in the components of device 100B. When device 100B stops operating, the components of device 100B may thermally contract as device 100B cools. The thermal expansion and contraction of the components of device 100B may cause damage to device 100B and may interfere with the operation of device 100B. Therefore, it may be desirable to remove heat to prevent damage to the components of device 100B.

Cooling element 140B may remove heat from device 100B during operation to reduce thermal expansion and thermal contraction. Therefore, by removing heat from device 100B, cooling element 140B may prevent damage to device 100B and improve the performance of device 100B. Device 100B may comprise an all-in-one solution that includes all of the components depicted in FIG. 1B so that even a relatively inexperienced customer may install device 100B with relatively little effort. Device 100B may include the components depicted in FIG. 1B integrated into a single device, such that device 100B has a smaller foot print and lower cost, as compared to assembling discrete components to build device 100B. Device 100B may have good thermal performance and electrical performance because of the removal of heat by cooling element 140B.

Device 100B may also include standardized interfaces for input signals and output signals. The standardized interfaces may include a first power pin for a high-side power supply and a first power pin for a low-side power supply. Device 100B may include interfaces for sensing of temperature of the components of device 100B. Device 100B may include interfaces for sensing of electrical currents through switches 110B and 112B. If cooling element 140B is a fluid-cooling element, device 100B may include interface(s) for fluid that can move through cooling element 140B.

Figure 1C:
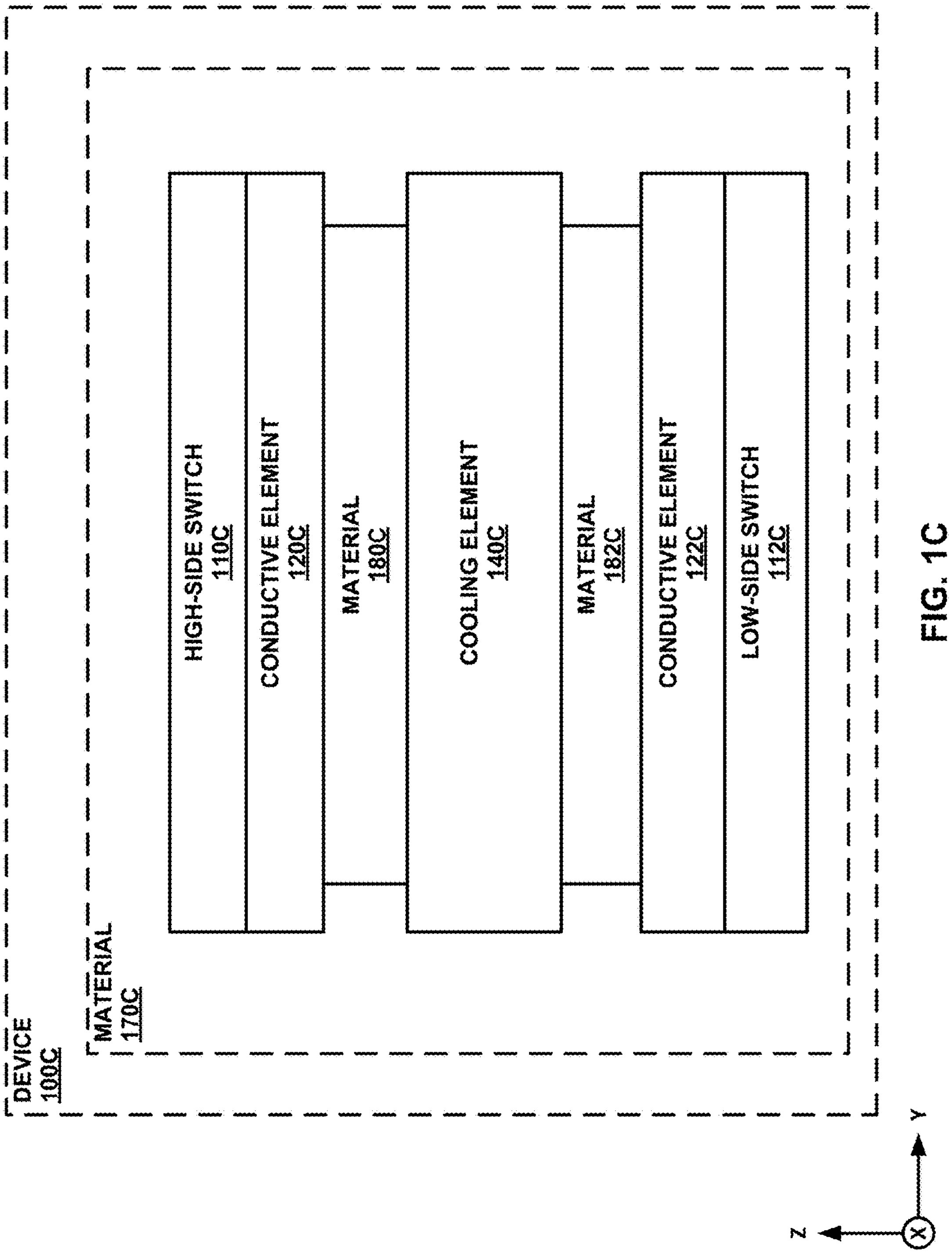
FIG. 1C is a conceptual block diagram illustrating a cooling element positioned between thermally conductive material, in accordance with some examples of this disclosure.
Figure 1D:
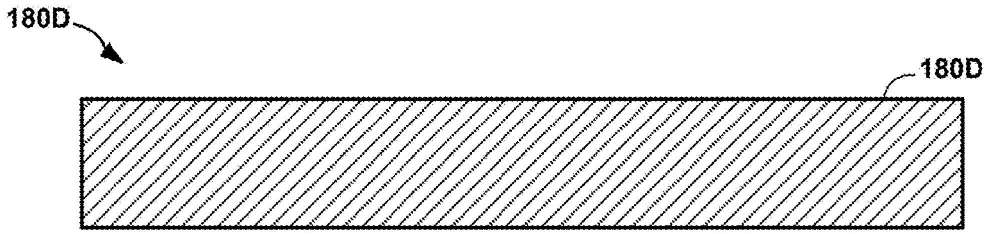
FIGS. 1D-1G are conceptual block diagrams illustrating material that may be positioned adjacent to a cooling element or a switch, in accordance with some examples of this disclosure.
Figure 1E:
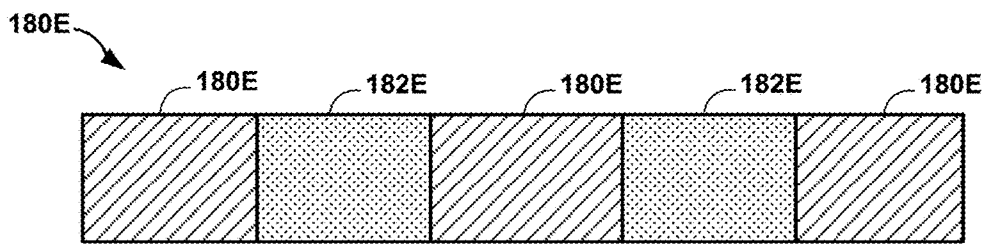
Figure 1F:
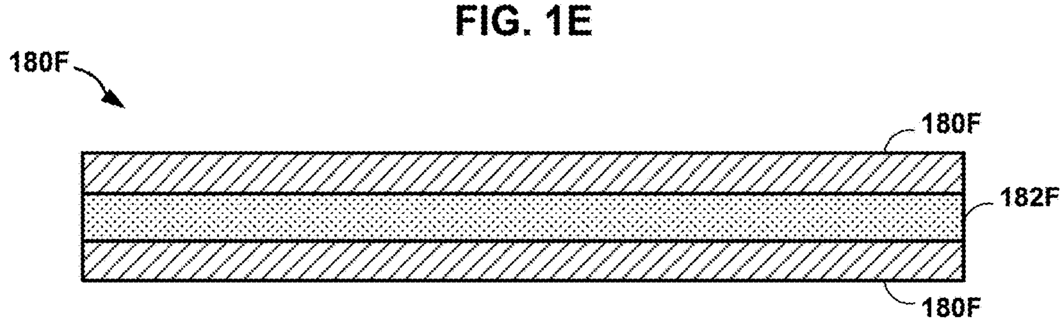
Figure 1G:
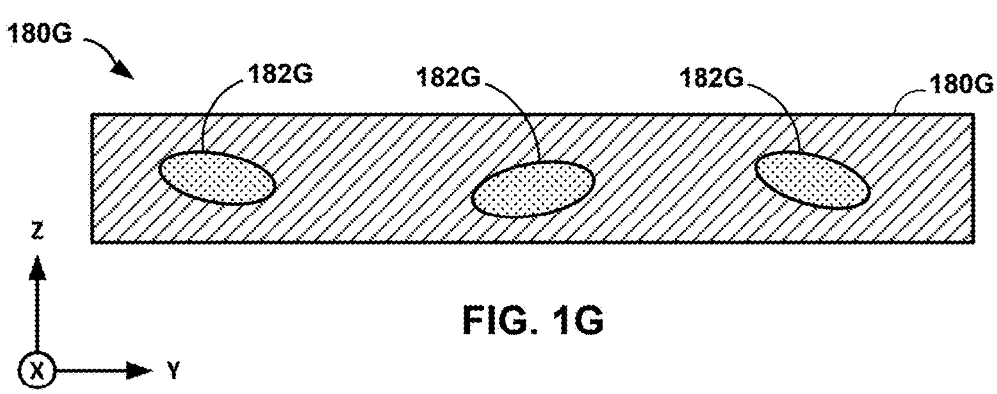

FIG. 1C is a conceptual block diagram illustrating a cooling element 140C positioned between thermally conductive material 180C and 182C, in accordance with some examples of this disclosure. Device 100C is a two-material approach (material 180C and 182C) to dissipating heat from switches 110C and 112C. Device 100A, in contrast, is a one-material approach to dissipating heat from switches 110A and 112A.

Material 180C and 182C may be thermally conductive and electrically insulating in order to prevent cooling element 140C from interfering with the electrical operation of switches 110C and 112C and conductive elements 120C and 122C. Material 180C and 182C may also be configured to prevent the movement of fluid between cooling element 140C and the other components of device 100C. Material 180C and 182C may include a thermally conductive material such as a liquid that sets in place, a ceramic, a spacer, a thermosetting polymer such as a duroplast material, and/or any other suitable material. A thermosetting polymer material may be better suited than thermoplastic material (e.g., thermosoftening plastic) for direct contact with a semiconductor switch. As shown in FIGS. 1D-1G, material 180C and 182C may be one homogeneous material or a heterogeneous mixture of more than one material.

The distance between cooling element 140C and conductive elements 120C and 122C may affect the thermal conductivity of cooling element 140C. Material 180C and 182C may fill all or some of the distance between cooling element 140C and conductive elements 120C and 122C. A relatively small distance between cooling element 140C and conductive elements 120C and 122C may improve the thermal conductivity between cooling element 140C and conductive elements 120C and 122C, as compared to a larger distance between cooling element 140C and conductive elements 120C and 122C. However, a small distance may increase the chances that cooling element 140C interferes with the electrical performance of the other components of device 100C. One important aspect of the electrical performance of device 100C is the stray inductance caused by electrical current through the components of device 100C.

In some examples, the distance through material 180C between conductive element 120C and cooling element 140C may be in a range from two hundred micrometers to one millimeter, a range from three hundred micrometers to eight hundred micrometers, or a range of up to two millimeters. Similarly, the distance through material 182C between conductive element 122C and cooling element 140C may be in a range from two hundred micrometers to one millimeter, a range from three hundred micrometers to eight hundred micrometers, or a range up to two millimeters. These distances may be sufficiently large to electrically isolate cooling element 140C from conductive elements 120C and 122C while still providing thermal conductivity.

Material 170C may encapsulate switches 110C and 112C, conductive elements 120C and 122C, cooling element 140C, and material 180C and 182C. Cooling element 140C may be either a separate component that is constructed outside of device 100C. Alternatively, cooling element 140C may be formed in situ out of material 170C such that material 170C forms the walls or boundaries of cooling element 140C. Material 170C may include a thermoplastic material, a mold compound, and/or any other suitable material. Materials 170C, 180C, and 182C may be positioned in device 100C such that cooling element 140C is separated from, and not in direct contact with, conductive elements 120C and 122C. Material 170C may have a lower level of ionic purity than material 180C. The case or housing of device 100C may include material 170C such that material 170C defines the outer dimension and the shape of device 100C.

Material 170C may be formed on device 100C such that material 170C fills all or almost all of the gaps between the components of device 100C to ensure sufficient isolation robustness (e.g., electrical, mechanical, moisture diffusion). Device 100C may be designed with small distances to be filled by material 170C to facilitate the thermal conduction between components. Small distances between components may be desirable for thermal performance, but small distances may result in electrical issues, such as short circuits, parasitic capacitance, and parasitic inductance.

FIGS. 1D-1G are conceptual block diagrams illustrating material that may be positioned adjacent to a cooling element or a switch, in accordance with some examples of this disclosure. Any of materials 180D-180G, or a combination thereof, may be positioned adjacent a cooling element or switch, such as the positioning of material 180C and/or material 182C in FIG. 1C. For example, material 180D is a homogeneous composition of material 190D. Material 180E is a heterogeneous composition of materials 190E and 192E in vertical layers. Material 180F is a heterogeneous composition of materials 190F and 192F in horizontal layers. Material 180G is a heterogeneous composition of material 190G with pockets of material 192G inside material 190G.

Figure 2:
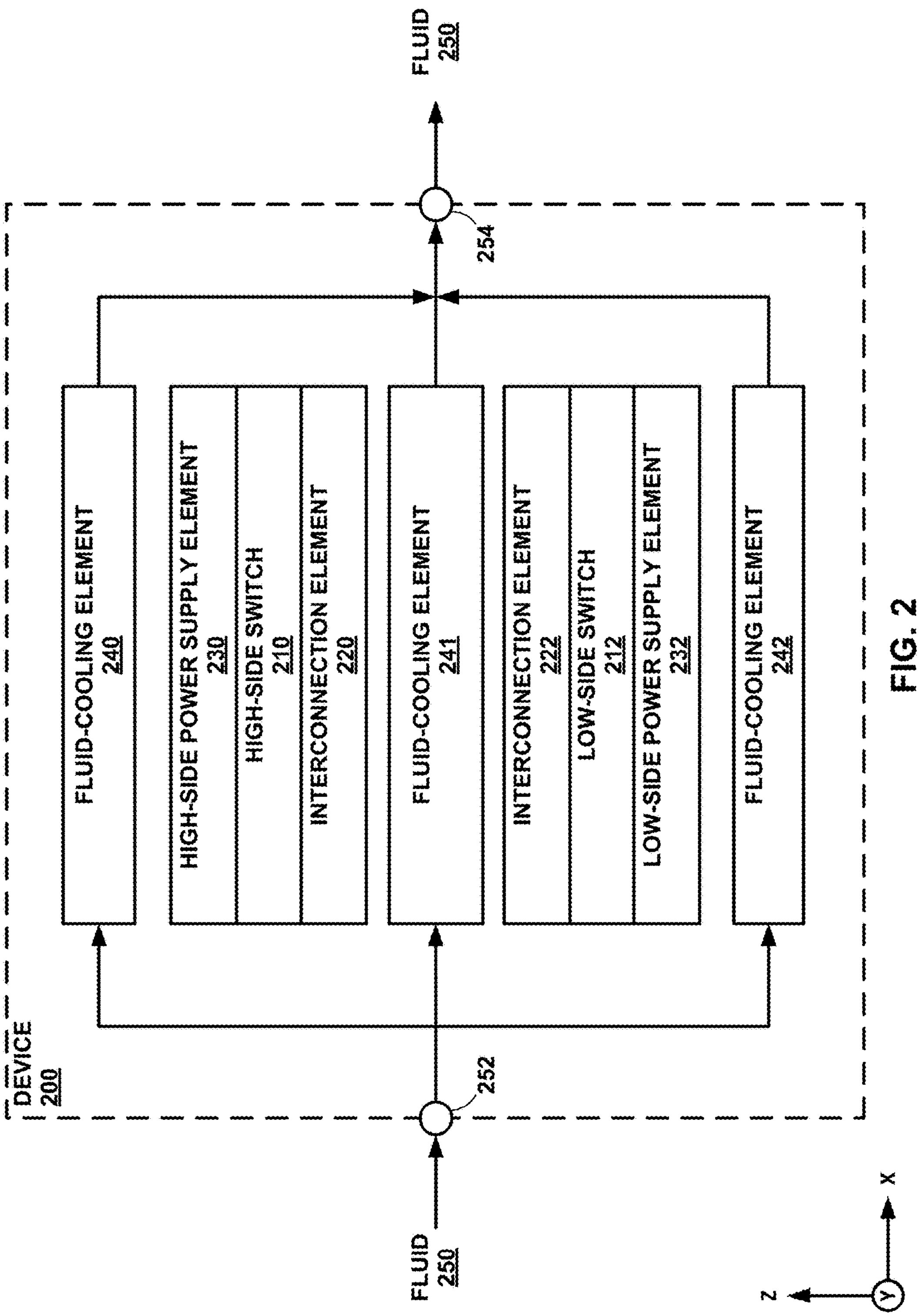
FIG. 2 is a conceptual block diagram illustrating fluid-cooling elements positioned on both sides of two switches, in accordance with some examples of this disclosure.

FIG. 2 is a conceptual block diagram illustrating fluid-cooling elements 240-242 positioned on both sides of two switches 210 and 212, in accordance with some examples of this disclosure. Fluid-cooling element 240 may be positioned to remove heat from high-side switch 210 through high-side power supply element 230. Fluid-cooling element 242 may be positioned to remove heat from low-side switch 212 through low-side power supply element 232. Fluid-cooling elements 240-242 may provide cooling to the top and the bottom of switches 210 and 212.

Device 200 may also include thermally conductive material between fluid-cooling element 240 and conductive element 230, between fluid-cooling element 241 and each of conductive elements 220 and 222, and between fluid-cooling element 242 and conductive element 232. The thermally conductive material may have similar properties to material 180C and 182C shown in FIG. 1C. The thermally conductive material preferably has good gap filling properties such that no voiding occurs between elements.

Figure 7:
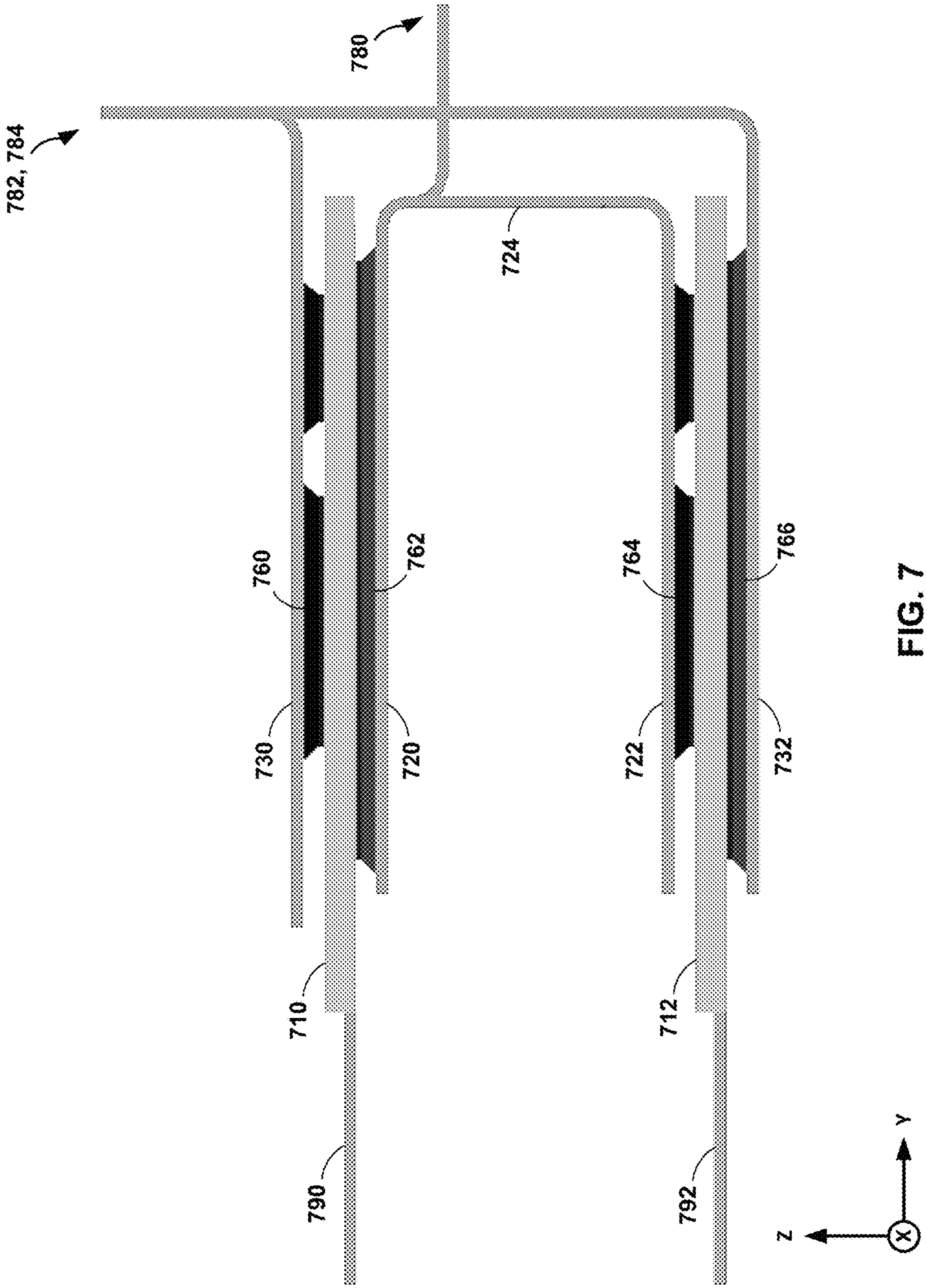
FIG. 7 is a side-view diagram of two switches that are electrically connected by two interconnect elements, in accordance with some examples of this disclosure.

Interconnect elements 220 and 222 may be electrically connected to form a C-shaped interconnect element. The design of the C-shaped interconnect element may allow the interconnect element to curve around cooling element 241 for better thermal performance. FIG. 7 depicts an example of a C-shaped interconnect element as interconnect elements 720, 722, and 724. The C-shaped interconnect element may increase the surface area of interconnect elements 220 and 222 that can deliver or radiate heat from switches 210 and 212 to fluid-cooling element 241.

Power supply elements 230 and 232 may operate as voltage rails for switches 210 and 212 by delivering or receiving a high-side power supply (e.g., $V_{DD}$) and a low-side power supply (e.g., reference ground). High-side power supply element 230 may be referred to as "an outside high-side conductive element" because high-side power supply element 230 is positioned towards the outside of device 200 relative to switch 210. High-side power supply element 230 may be positioned between high-side switch 210 and high-side fluid-cooling element 240. Interconnection element 220 may be referred to as "a middle high-side conductive element," and interconnection element 222 may be referred to as "a middle low-side conductive element" because interconnection elements 220 and 222 are inside of switches 210 and 212 and proximate middle cooling element 241.

In some examples, a device may include DBC compositions between each of switches 210 and 212 and each of fluid-cooling elements 240-242. A first copper layer in a DBC composition may operate as one of conductive elements 220, 222, 230, and 232, while the second copper layer may be electrically isolated from switches 210 and 212. The second copper layer may be in direct contact with fluid 250 for good thermal conductivity. The second copper layer may be electrically isolated from internal current path of device 200. However, the DBC composition may be thicker than a single conductive element, so it may be desirable to use a single conductive element.

Fluid-cooling elements 240-242 may be configured to carry fluid 250 through device 200 to remove heat from switches 210 and 212. Fluid 250 may be a gas or a liquid, such as liquid water or carbon dioxide gas. Fluid-cooling elements 240-242 may include a tube, chamber, or a channel that carries fluid 250. The material of the tube, chamber, or channel of fluid-cooling element may be designed to conduct heat but not conduct electricity. Fluid-cooling elements 240-242 may absorb heat from the components of device 200, such as switches 210 and 212 and conductive elements 220, 222, 230, and 232.

Device 200 may be configured to receive fluid 250 at interface 252. Fluid-cooling elements 240-242 may be configured to carry fluid 250 to interface 254. Interfaces 252 and 254 may be holes in the surface of device 200, with an opening diameter of eight to ten millimeters in some examples. Examples of interfaces 252 and 254 are depicted in FIG. 9 as interface 952 and depicted in FIG. 15 as interface 1552. An external device such as a pump or a radiator may deliver water to interface 252 and/or interface 254.

Figure 3:
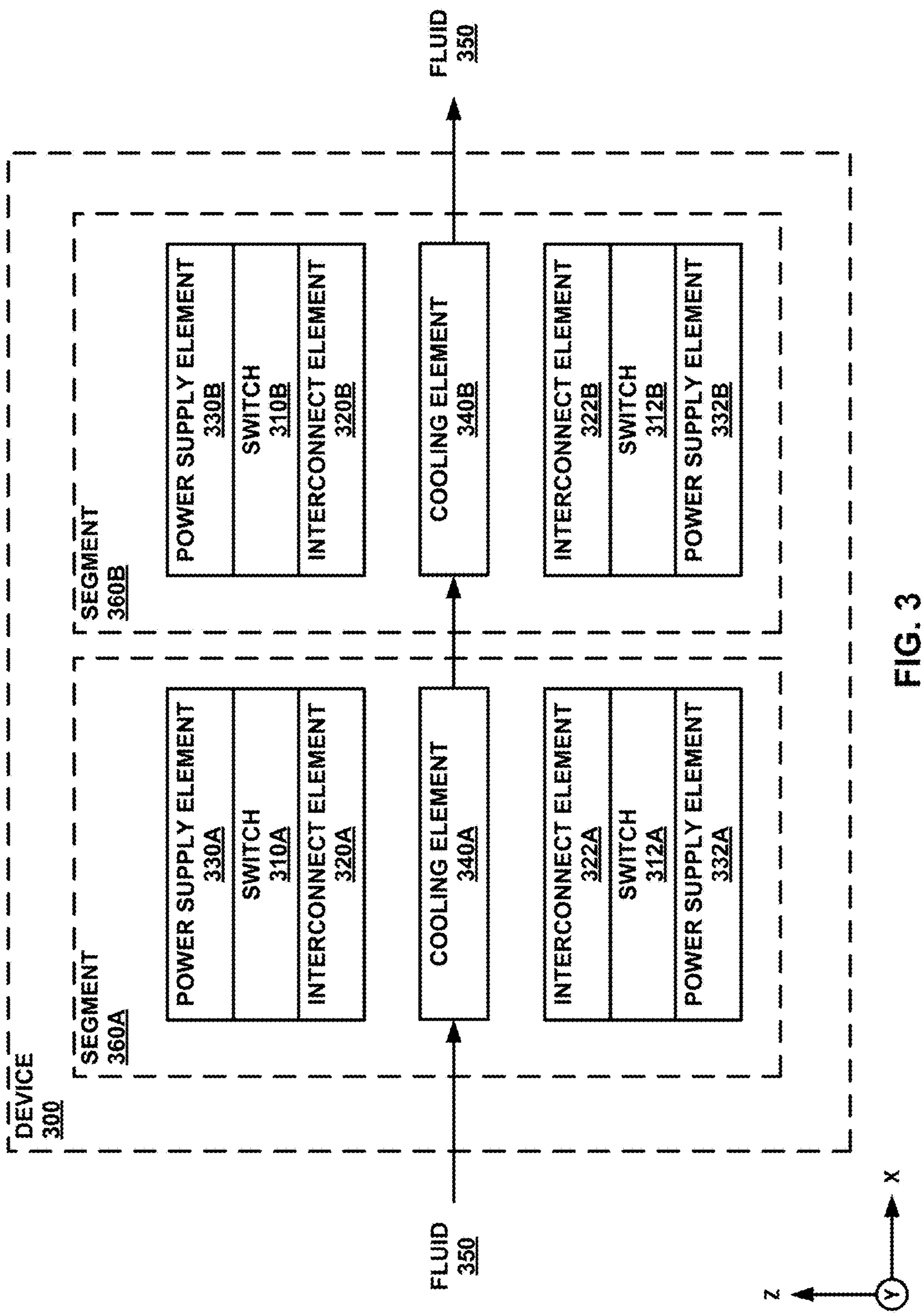
FIG. 3 is a conceptual block diagram illustrating a device including two segments, where each segment includes a cooling element, in accordance with some examples of this disclosure.

FIG. 3 is a conceptual block diagram illustrating a device 300 including two segments 360A and 360B, where each segment of segments 360A and 360B includes a cooling element of cooling elements 340A and 340B, in accordance with some examples of this disclosure. Each of segments 360A and 360B may be configured to operate as a phase in a multiphase power converter. In the example of FIG. 3, device 300 includes two phases, where a first phase is segment 360A and a second phase is segment 360B.

Segment 360A may include a first half-bridge circuit including switches 310A and 312A. The first half-bridge circuit may generate a first output signal at interconnect elements 320A and 322A, which may be electrically connected to form a C-shaped interconnect element. Segment 360B may include a second half-bridge circuit configured to generate a second output signal at interconnect elements 320B and 322B. Device 300 may be configured to deliver the first output signal and the second output signal to an electrical load, such as an electrical motor, a light source, an electronic device, or any other suitable electrical load.

Cooling elements 340A and 340B may be connected in series, such that fluid 350 flows first through cooling element 340A and then through cooling element 340B. Cooling elements 340A and 340B may be a single cooling element that stretches through both of segments 360A and 360B.

Each of segments 360A and 360B may be a sub-module that can be combined with other sub-modules to form a larger device. For example, a three-phase device can be built by positioning three sub-modules in between the interconnect elements of a C-shaped interconnect element. Each sub-module can include a half-bridge circuit in this example. In addition, six sub-modules can be positioned in between the interconnect elements of a C-shaped interconnect element to form a six-pick device that includes three H-bridge circuits, where each H-bridge includes two sub-modules, or three half-bridge circuit, where each half-bridge includes two sub-modules connected in parallel.

Figure 5:
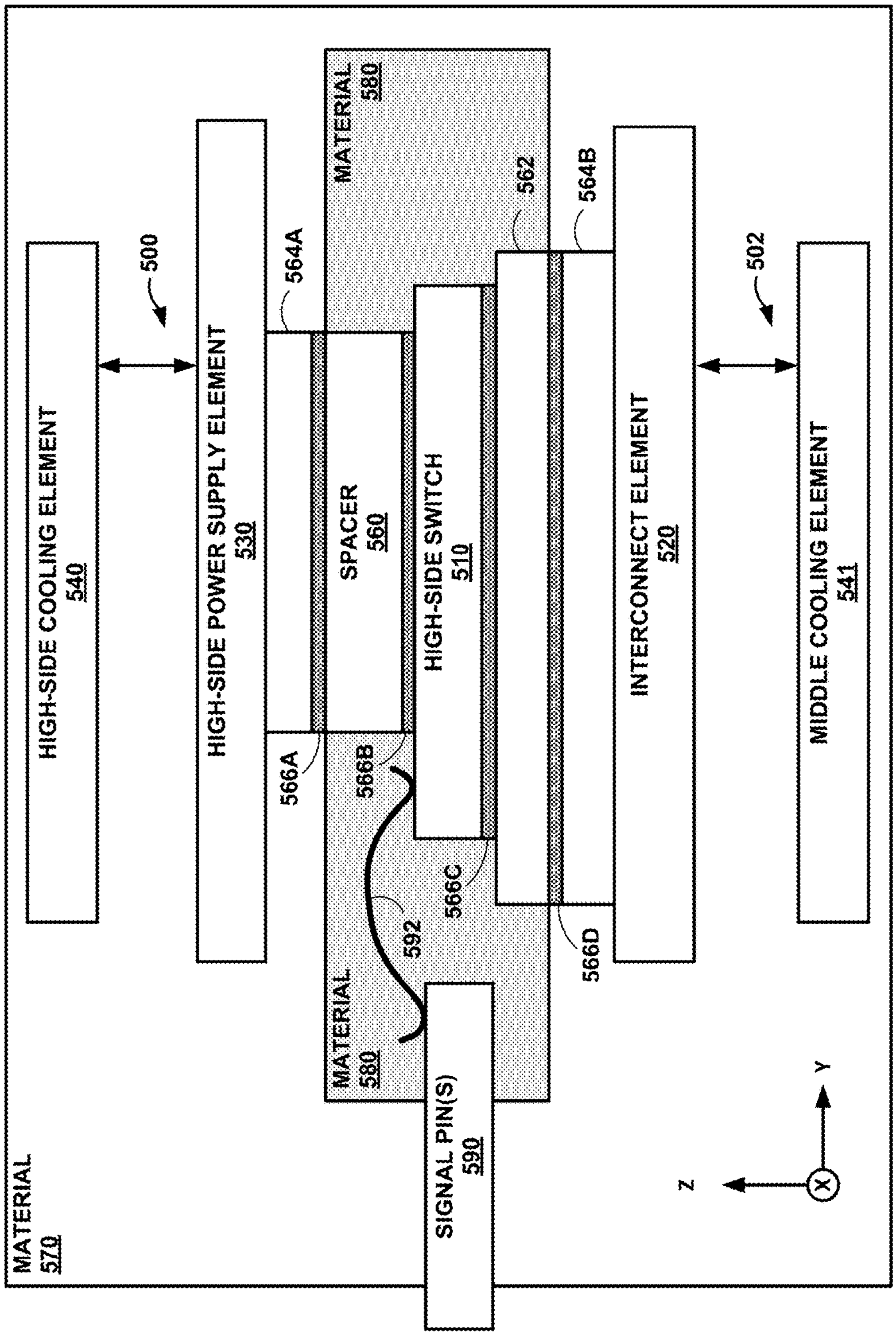
FIG. 5 is a conceptual block diagram illustrating a switch encapsulated in material, in accordance with some examples of this disclosure.

FIG. 4A is a conceptual block diagram illustrating a device 400A including a printed circuit board (PCB) 470A and four electrical interfaces 480A, 482A, 484A, and 486A, in accordance with some examples of this disclosure. PCB 470A may be configured to deliver control signals to switches 410A and 412A through connections 490A and 492A to control the operation of switches 410A and 412A. PCB 470A may use control signals to turn on and off switches 410A and 412A. Examples of connections 490A and 492A are depicted in FIG. 5 as signal pin 590, in FIGS. 6A-6C as signal pins 690, in FIG. 7 as signal pins 790 and 792, and in FIGS. 10A-10C as signal pins 1090A and 1090B.

PCB 470A may be configured to receive electrical power through interface 486A to drive logic circuitry in PCB 470A. Device 400A may include mold compound and/or thermoplastic material that at least partially encapsulates PCB 470A. However, the mold compound and/or thermoplastic material may not cover electrical interface 486A, so that an external device may be electrically connected to interface 486A. Device 400A may include driver electronics (e.g., gate driver logic circuitry) mounted on PCB 470A and configured to generate control signals for switches 410A and 412A.

Figure 15:
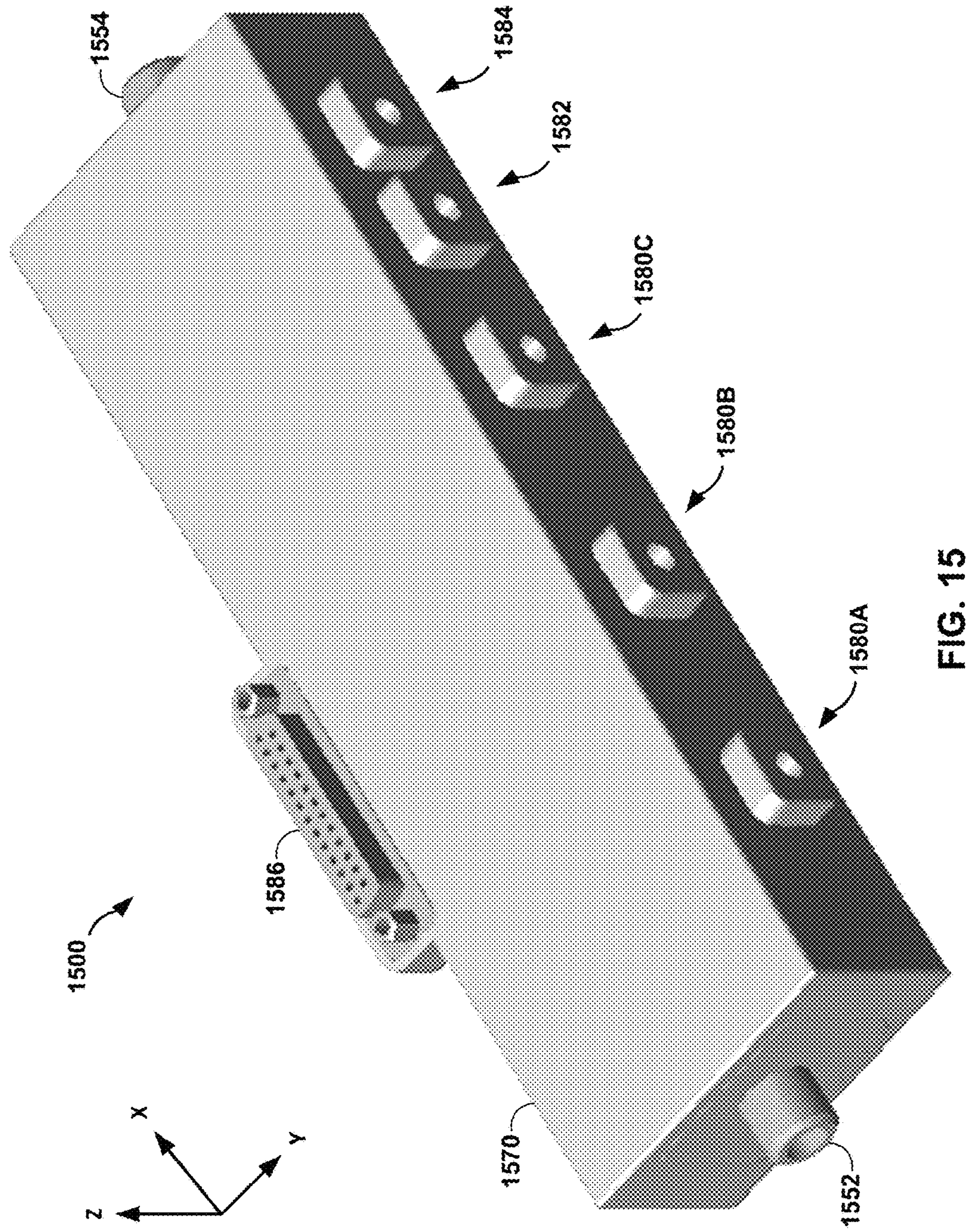
FIG. 15 is a perspective diagram of a housing with electrical interfaces and fluid interfaces, in accordance with some examples of this disclosure.

PCB 470A may be configured to operate as an internal redistribution element towards a standardized interface such as interface 486A or interface 1586 in FIG. 15, which is an example of a standardized interface. Device 400A may include a different redistribution element such as a lead-frame structure, an intelligent power module, and/or another element with switching or sensing functionalities. There may be separate redistribution elements for high-side switches and low-side switches, or device 400A may include a single redistribution element for all switches.

Interface 480A may be configured to deliver an output signal to an external device. Switches 410A and 412A may be configured to operate as a half-bridge circuit or as part of an H-bridge circuit to generate the output signal at interconnect elements 420A and 422A. Each of interfaces 482A and 484A may be configured to receive a power supply signal, such as reference ground or a high-side power supply signal. Interfaces 480A, 482A, and 484A may include a conductive surface or a conductive hole to form an electrical connection with an external component. Interfaces 480A, 482A, and 484A may be designed to allow soldering of wires or other electrical conductors to form electrical connection(s).

Figure 11:
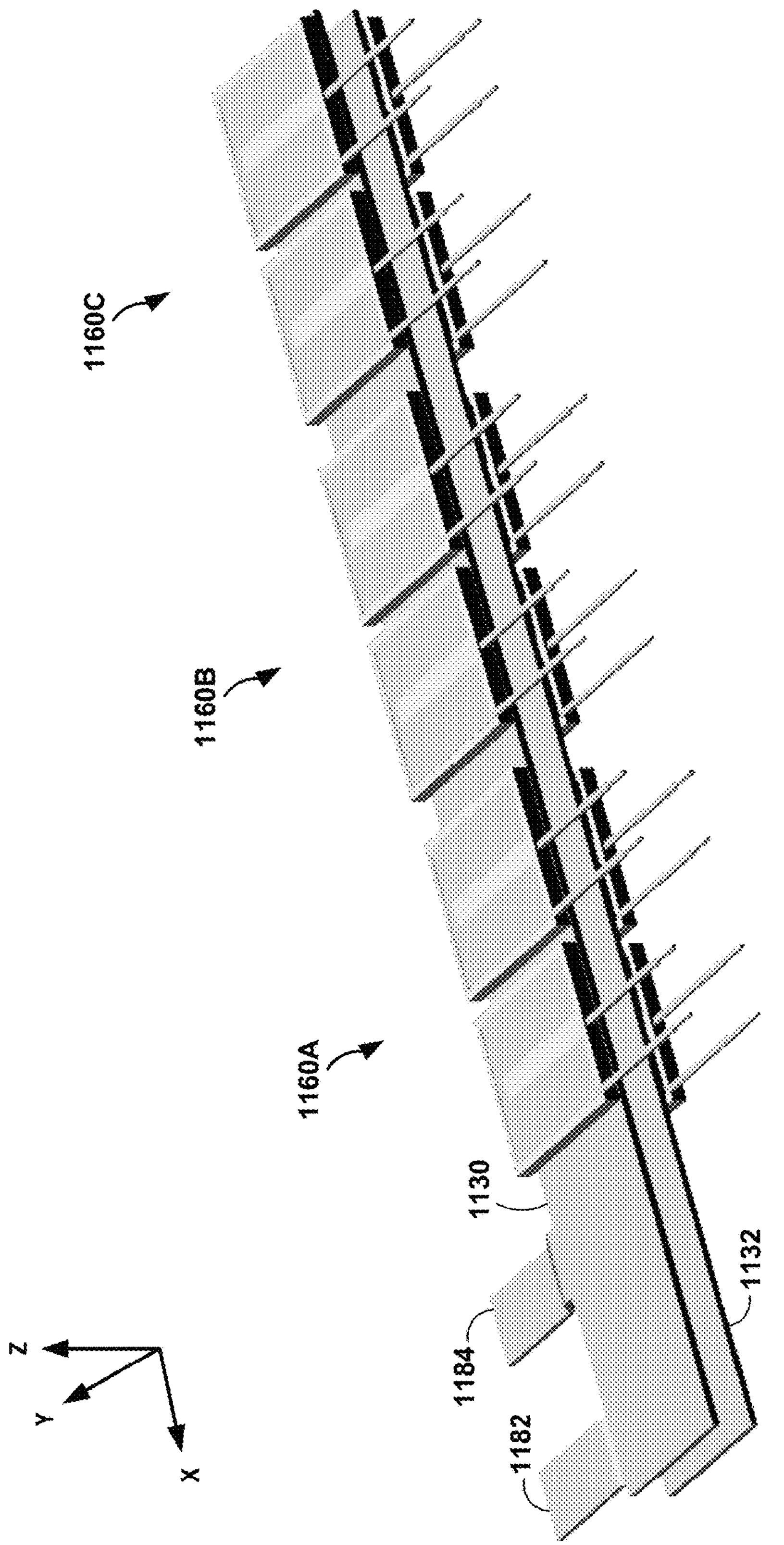
FIG. 11 is a perspective diagram of a semiconductor sub-module including three segments and twelve switches, in accordance with some examples of this disclosure.
Figure 12:
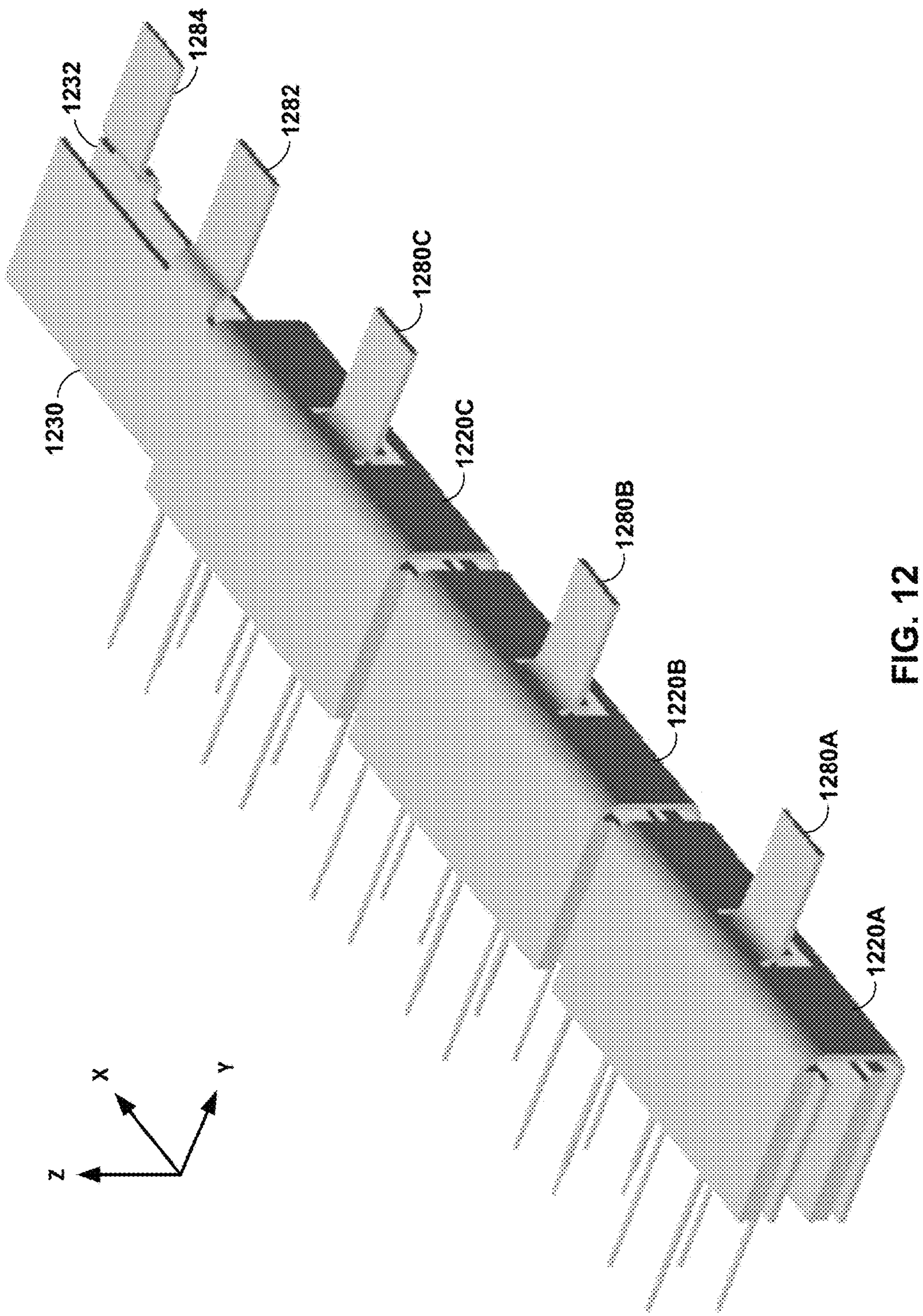
FIG. 12 is a perspective diagram of a semiconductor sub-module including interconnect elements positioned on the outside of the switches, in accordance with some examples of this disclosure.

FIG. 4B is a conceptual block diagram illustrating a device 400B including interconnect elements 420B and 422B positioned on the outside of two switches 410B and 412B, in accordance with some examples of this disclosure. Interconnect elements 420B and 422B may be electrically connected to form a C-shaped interconnect element and configured to deliver an output signal to interface 480B. Power supply elements 430B and 432B may be positioned inside of switches 410B and 412B and adjacent to cooling element 441B. Device 400B may include material between power supply elements 430B and 432B and cooling element 441B to provide electrical insulation. FIGS. 11 and 12 depict an example of device 400B with a C-shaped interconnect element on the outside of switches 410B and 412B.

Figure 8:
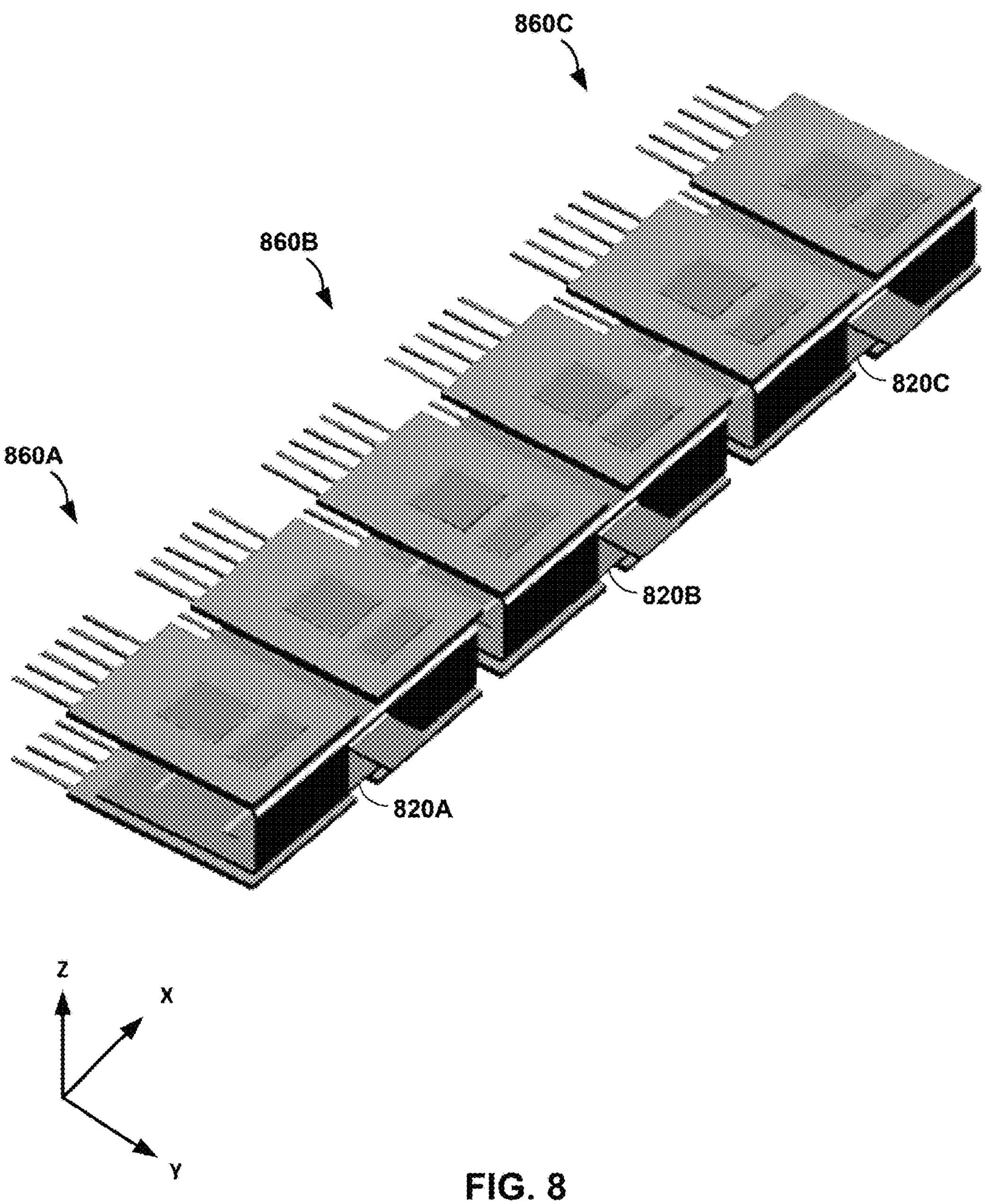
FIG. 8 is a perspective diagram of a semiconductor sub-module including interconnect elements positioned on the inside of the switches, in accordance with some examples of this disclosure.

Interconnect elements 420B and 422B and interconnect elements 1220A-1220C in FIG. 12 are examples of C-shaped interconnect elements that are positioned outside of two switches. Interconnect elements 420A and 422A, interconnect elements 720 and 722 in FIG. 7, and interconnect element 820 in FIG. 8 are examples of C-shaped interconnect elements that are positioned inside two switches.

FIGS. 4C and 4E are conceptual block diagrams illustrating C-shaped interconnect elements, in accordance with some examples of this disclosure. FIG. 4C shows inside conductive elements 430C and 422C electrically connected to operate as an output element configured to deliver output signal 460C. FIG. 4D is a circuit diagram illustrating a half-bridge circuit including switches 410C and 412C. Although FIG. 4D depicts switches 410C and 412C as bipolar transistors, switches 410C and 412C may be FET transistors, IGBTs, or any other form of transistors.

FIG. 4E shows outside conductive elements 420E and 432E electrically connected to operate as an output element configured to deliver output signal 460E. Configuring outside conductive elements 420E and 432E to deliver output signal 460E increases the distance for output signal 460E to travel and decreases the distance for power supplies 450E and 452E to travel, as compared to the configuration in FIG. 4C. The configuration of FIG. 4E (output elements on the outside) may have lower stray inductance and lower impedance than the configuration of FIG. 4C (output elements on the inside). These electrical characteristics may be desirable for a semiconductor device.

FIG. 5 is a conceptual block diagram illustrating a switch 510 encapsulated in material 580, in accordance with some examples of this disclosure. High-side switch 510 may be configured to receive control signals via signal pin(s) 590 and wire bond 592, which may include aluminum, copper, and/or another conductive material. Signal pin(s) 590 may also be configured to transmit signals representing temperature and electrical current amplitude for temperature sensing and current sensing to a component outside of material 580 (see, e.g., pins 690 shown in FIGS. 6A-6C and pins 1090A and 1090B shown in FIGS. 10A-10C). High-side switch 510 may be configured to conduct electricity between load terminals, where a first load terminal is electrically connected to high-side power supply element 530 and a second load terminal is electrically connected to interconnect element 520.

High-side switch 510 may be electrically connected to interconnect element 520 though spacer attach layer 566B, spacer 560, connecting layer 566A, and optional mounting post 564A. High-side switch 510 may be electrically connected to high-side power supply element 530 though die attach layer 566C, lead frame 562, connecting layer 566D, and optional mounting post 564B. Connecting layers 566A and 566D and attach layers 566B and 566C may include conductive material such as solder or sinter material. Mounting posts 564A and 564B may be formed by embossing.

Material 580 may include thermally conductive and electrically insulating material such as a thermosetting polymer, a ceramic, or any other suitable material. Materials 180C-180F depicted in FIGS. 1C-1F are examples of material 580. Material 580 may partially or fully encapsulate high-side switch 510 to electrically insulate high-side switch 510 while providing thermal conduction.

Spacer 560 and lead frame 562 may be configured to conduct electricity between the load terminals of high-side switch 510 and elements 520 and 530. Spacer 560 and lead frame 562 may be attached to high-side switch 510 by soldering, sintering, pasting, taping, gluing, diffusion bonding, and/or another method. Examples of spacer 560 and lead frame 562 include spacer 660 in FIGS. 6B and 6C and spacer 1060 in FIGS. 10B and 10C. Spacer 560 may include copper, AlSiC (aluminum matrix with silicon carbide particles), molybdenum-copper, and/or any other conductive material.

Interconnect element 520 may be separated from middle cooling element 541 by material 570, which may include thermoplastic material or another thermally conductive and electrically insulating material. High-side power supply element 530 may be separated from high-side cooling element 540 by material 570. Distances 500 and 502 through material 570 may be in a range from two hundred micrometers to one millimeter, a range from three hundred micrometers to eight hundred micrometers, or a range up to two millimeters. These distance ranges may also apply for a low-side switch, which is not shown in FIG. 5.

Material 570 may fully encapsulate some of the components of the device depicted in FIG. 5, including switch 510, interconnect element 520, power supply element 530, and cooling elements 540 and 541. Material 570 may partially encapsulate some of the components of the device, such as interfaces for electrical signals and interfaces for cooling fluid.

Figures 6A, 6B, 6C:
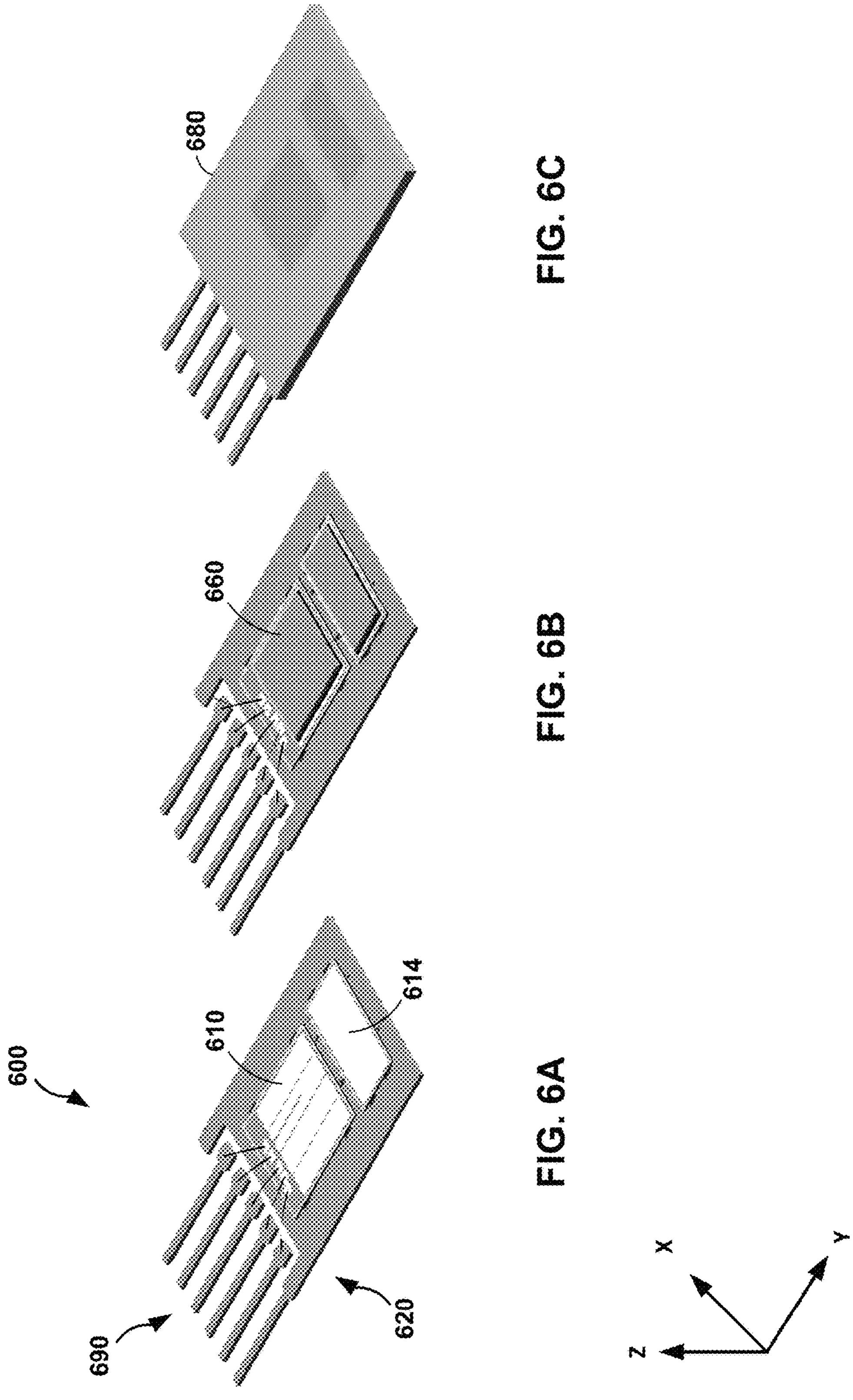
FIGS. 6A-6C are perspective diagrams of a switch encapsulated in material, in accordance with some examples of this disclosure.

FIGS. 6A-6C are perspective diagrams of a switch 610 encapsulated in material 680, in accordance with some examples of this disclosure. FIG. 6A depicts a first stage of the assembly process, in which switch 610 and diode 614 are positioned on and electrically connected to conductive element 620. Signal pins 690 may be electrically connected to switch 610 and conductive element 620. Signal pins 690 may include connections for temperature sensing and current sensing.

FIG. 6B depicts the attachment of spacer 660 to switch 610 and the attachment of a second spacer to diode 614. Spacer 660 may prevent the direct contact of cooling material to the surface of switch 610, which lowers the risk of reliability issues due to ionic contamination. FIG. 6C depicts material 680 formed on switch 610, diode 614, and conductive element 620. Material 680 may partially encapsulate conductive element 620, spacer 660, and signal pins 690 to allow for electrical connections to external components, as shown in FIGS. 7 and 8. Spacer 660 may be exposed on top of module 600, and conductive element 620 may be exposed on the bottom of module 600.

FIG. 7 is a side-view diagram of two switches 710 and 712 that are electrically connected by two interconnect elements 720 and 722, in accordance with some examples of this disclosure. Interconnect element 720 may be electrically connected to switch 710 by spacer 762, and interconnect element 722 may be electrically connected to switch 712 by spacer 764. Interconnect elements 720 and 722 may be electrically connected by conductive element 724 to form a C-shaped interconnect element that is electrically connected to interface 780. Interface 780 may be configured to form an electrical connection with an external device to deliver an output signal that is generated by switches 710 and 712.

Power supply element 730 may be electrically connected to interface 782, and power supply element 732 may be electrically connected to interface 784. Power supply elements 730 and 732 may also be connected to standardized interface elements such as screw bolts. Interface 782 may be electrically isolated from interface 784 even though FIG. 7 shows interfaces 782 and 784 as overlapping. FIGS. 11 and 12 show examples of interfaces that overlap in two dimensions (e.g., the y-axis direction and the z-axis direction) but are offset in a third dimension (e.g., the x-axis direction).

A cooling element may be positioned between interconnect elements 720 and 722 to remove heat that is generated by switches 710 and 712. By forming a C-shaped interconnect element around the cooling element, the surface area of the interconnect element that is proximate to the cooling element may be increased. Increased surface area may result in an increase in the heat removed by the cooling element.

FIG. 8 is a perspective diagram of a semiconductor sub-module including interconnect elements 820A-820C positioned on the inside of the switches, in accordance with some examples of this disclosure. FIG. 8 depicts twelve switches assembled in a six-pick arrangement. Each of segments 860A-860C may include two high-side switches and two low-side switches. Each of segments 860A-860C may be configured in a half-bridge circuit, where the two high-side switches are electrically connected in parallel and the two low-side switches are electrically connected in parallel in order to double the flow of electrical current. Alternatively, each of segments 860A-860C may be configured in an H-bridge circuit.

Each of segments 860A-860C may include one of interconnect elements 820A-820C that is electrically isolated from the other interconnect elements. The device of FIG. 8 may be a three-phase power converter, where each of segments 860A-860C generates a separate output signal. However, all six high-side switches may be electrically connected to a single high-side power supply element (not shown in FIG. 8) that spans all six high-side switches. All six low-side switches may be electrically connected to a single low-side power supply element (not shown in FIG. 8) that spans all six low-side switches.

Interconnect elements 820A-820C may be electrically connected to the switches by soldering, sintering, pasting, taping, gluing, diffusion bonding, and/or thermal interface material (TIM). Interconnect elements 820A-820C may include conductive material such as copper or aluminum. Interconnect elements 820A-820C may be manufactured using bending and stamping techniques.

Figure 9B:
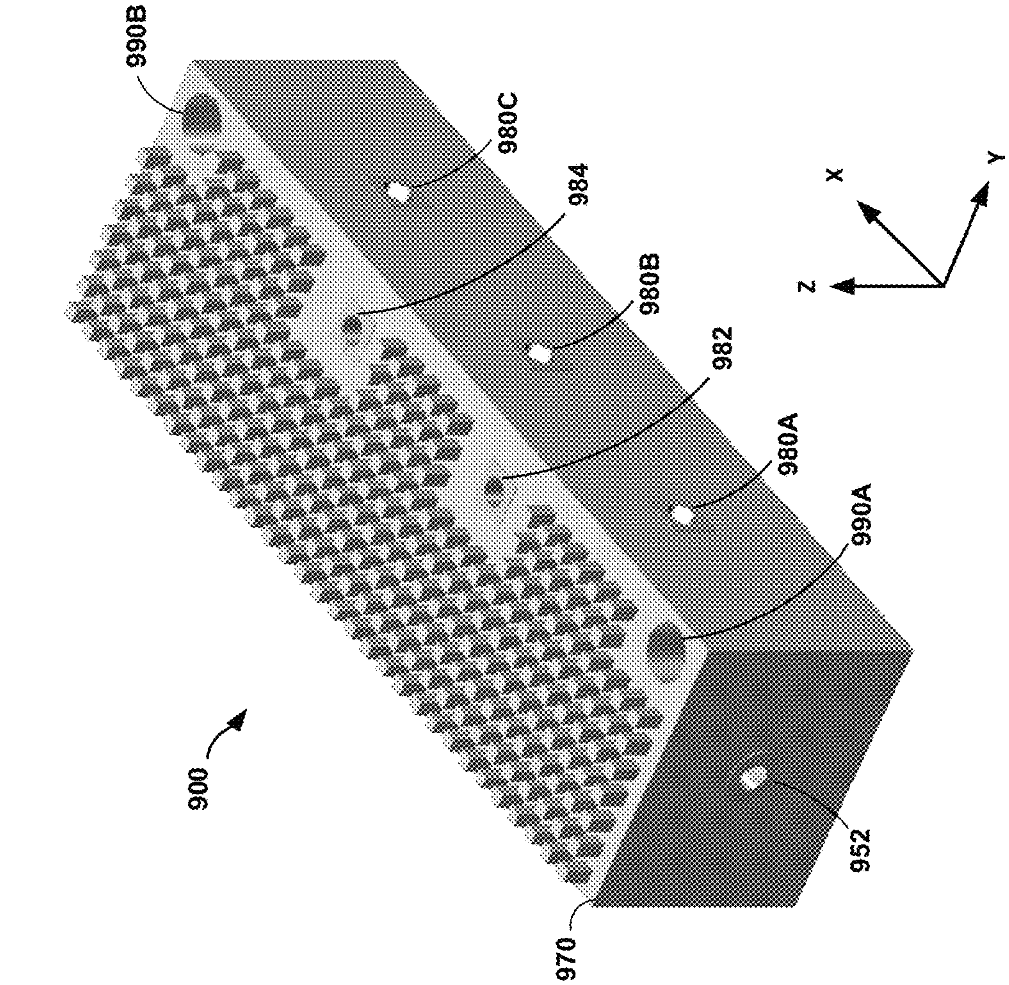
FIGS. 9A and 9B are perspective diagrams of a final module encapsulated in material with electrical interfaces and fluid interfaces, in accordance with some examples of this disclosure.
Figure 9A:
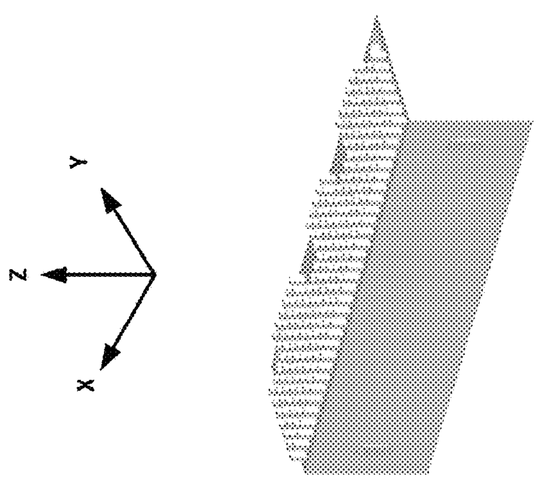

FIGS. 9A and 9B are perspective diagrams of a final module encapsulated in material 970 with electrical interfaces 980A-980C, 982, and 984 and fluid interfaces 952, in accordance with some examples of this disclosure. Fluid interface 952 may be configured to receive fluid from an external device such as a tube or pipe. Device 900 may include a second fluid interface that is configured to output the fluid to another external device. Material 970 may include thermoplastic material that can form cooling fins on the surface of device 900 as shown in FIGS. 9A and 9B. Electrical interfaces 980A-980C may be configured to generate output signals, such as three phases of signals for driving an electrical load. Electrical interfaces 982 and 984 may be configured to receive a high-side power supply and a low-side power supply.

Device 900 may be designed for easy installation because the user may have to only connect the fluid interfaces and electrical interfaces to external devices and connectors. Device 900 may be a simple plug-and-play solution with a small total volume. The customer or user may need to only connect interfaces to external devices because all of the components of device 900 are combined into one housing. Jackets 990A and 990B are positioned in the corners of device 900 and may be configured to receive cooling fluid.

Figure 10C:
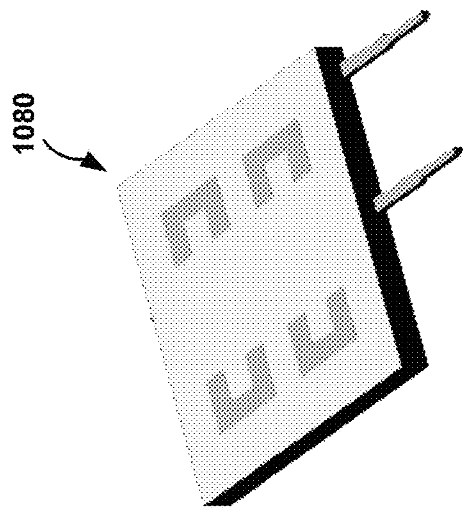
FIGS. 10A-10C are perspective diagrams of a switch encapsulated in material, in accordance with some examples of this disclosure.
Figure 10B:
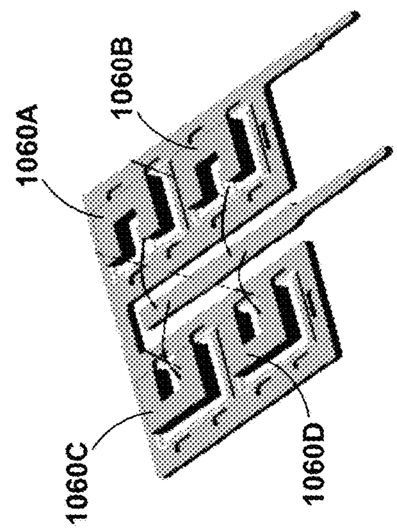
Figure 10A:
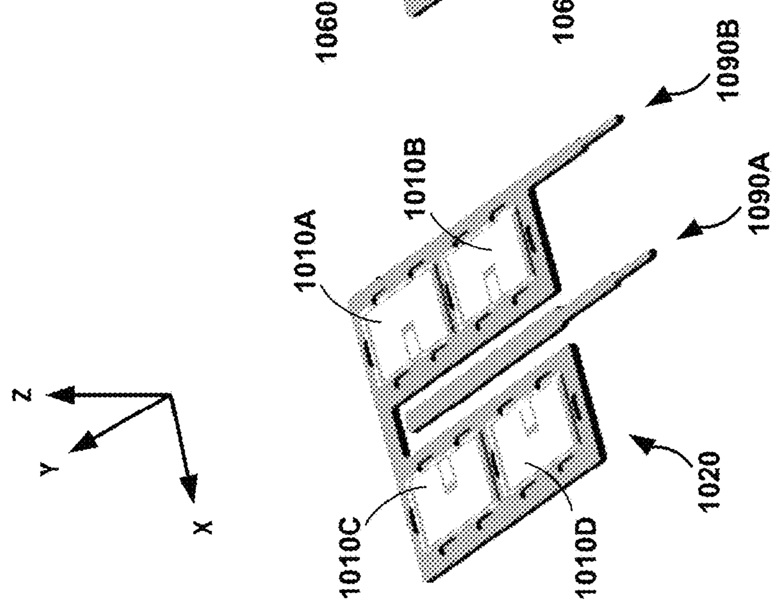

FIGS. 10A-10C are perspective diagrams of a switch encapsulated in material, in accordance with some examples of this disclosure. FIG. 10A depicts a first stage of the assembly process, in which switches 1010A-1010D are positioned on and electrically connected to conductive element 1020. Signal pin 1090 may be electrically connected to switches 1010A-1010D, as shown in FIG. 10B. FIG. 10B also depicts the attachment of spacers 1060A-1060D to switches 1010A-1010D. FIG. 10C depicts material 1080 formed on switches 1010A-1010D, conductive element 1020, and signal pins 1090A and 1090B. Material 1080 may partially encapsulate conductive element 1020, spacers 1060A-1060D, and signal pins 1090A and 1090B to allow for electrical connections to external components, as shown in FIGS. 11, 12, 14A and 14B.

FIG. 11 is a perspective diagram of a semiconductor sub-module including three segments 1160A-1160C and twelve switches, in accordance with some examples of this disclosure. In contrast to FIGS. 7 and 8, power supply elements 1130 and 1132 are positioned on the inside of the switches, rather than outside of the switches. A middle cooling element may be positioned adjacent to and inside of power supply elements 1130 and 1132. Power supply element 1130 may be electrically connected to a load terminal of all six of the high-side switches in FIG. 11, and power supply element 1132 may be electrically connected to a load terminal of all six of the low-side switches in FIG. 11.

The switches of FIG. 11 are depicted as having a load terminal in the positive z-axis direction and a load terminal in the negative z-axis direction. Each of the load terminals may have an exposed pad on the surface of the semiconductor die, which may be electrically connected to a conductive element, such as a copper layer. The signal pins of the switches may be exposed towards the sides of the switches in the negative y-axis direction.

FIG. 12 is a perspective diagram of a semiconductor sub-module including interconnect elements 1220A-1220C positioned on the outside of the switches, in accordance with some examples of this disclosure. Each of interconnect elements 1220A-1220C may include a C-shaped interconnect element that is positioned outside of the switches, in contrast to interconnect elements 720, 722, 724, and 820A-820C in FIGS. 7 and 8.

Figure 13:
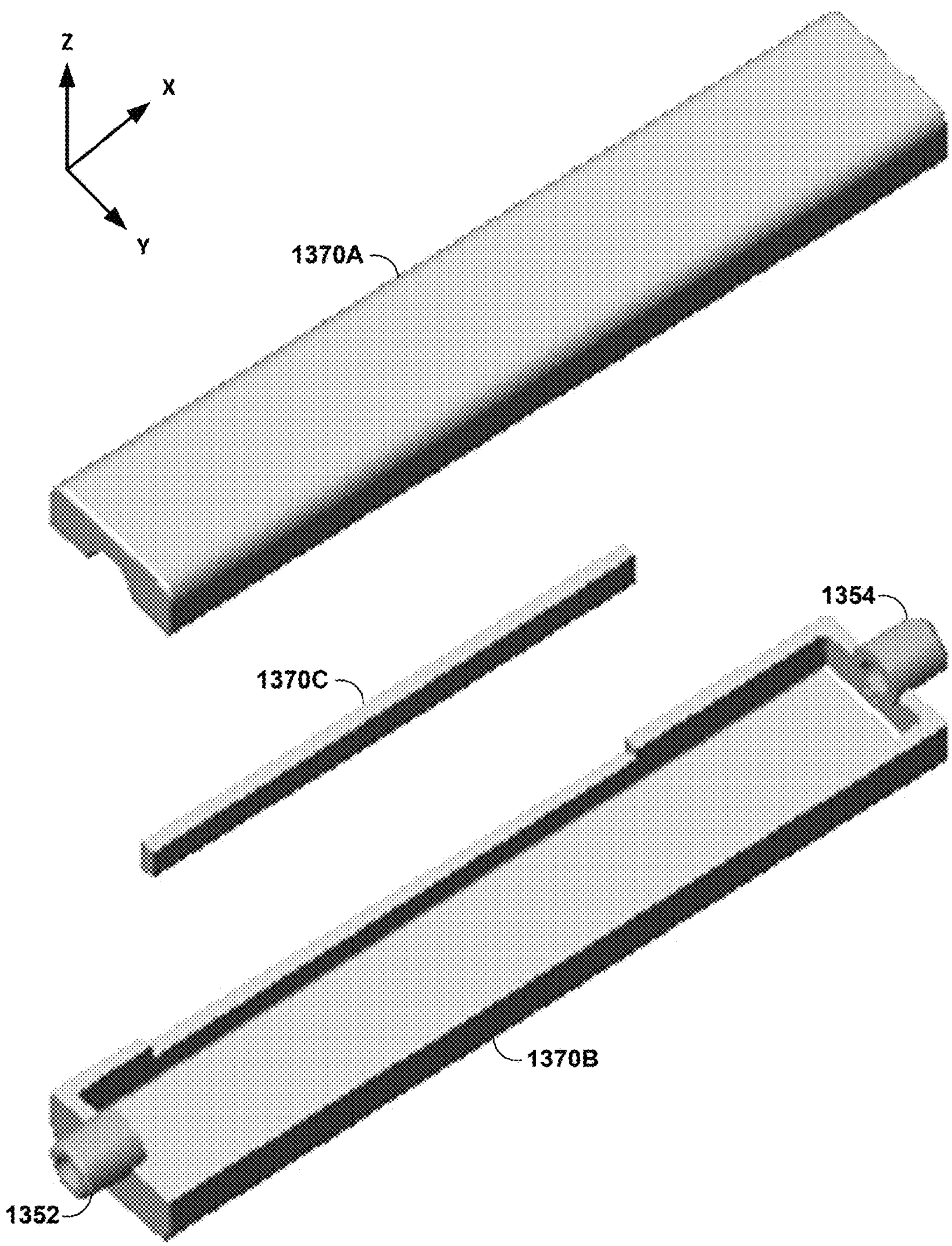
FIG. 13 is an exploded-view diagram of two half shells of a housing for a semiconductor sub-module, in accordance with some examples of this disclosure.

FIG. 13 is an exploded-view diagram of two half shells 1370A and 1370B of a housing for a semiconductor sub-module, in accordance with some examples of this disclosure. Half shells 1370A and 1370B and material 1370C may include a thermoplastic material that is thermally conductive and electrically insulating. Half shell 1370B includes fluid interfaces 1352 and 1354. Half shells 1370A and 1370B may fit together such that there is an opening for the signal pins of the device. Material 1370C may be configured to cover this opening while allowing connections to the signal pins.

Figure 14B:
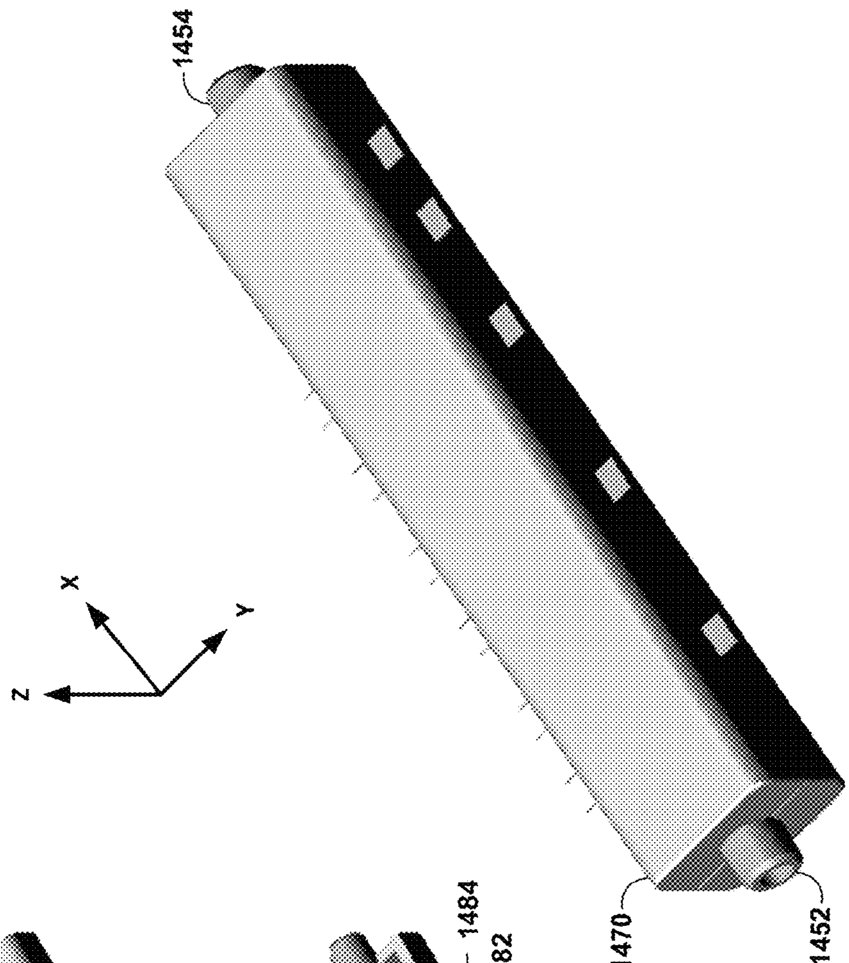
FIGS. 14A and 14B are perspective diagrams of a semiconductor sub-module in a housing, in accordance with some examples of this disclosure.
Figure 14A:
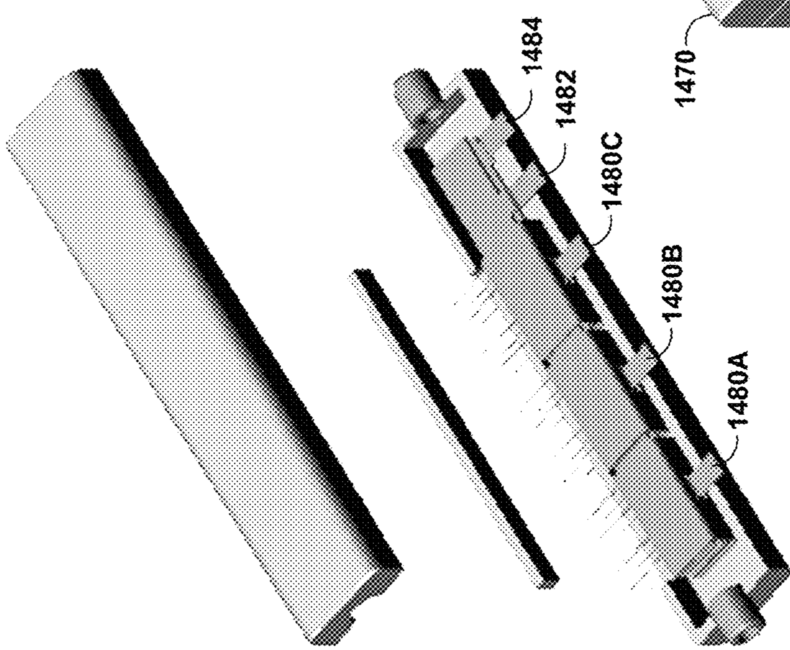

FIGS. 14A and 14B are perspective diagrams of a semiconductor sub-module in a housing 1470, in accordance with some examples of this disclosure. Housing 1470 includes fluid interfaces 1452 and 1454 for inputting and outputting fluid for cooling elements. Housing 1470 also includes electrical interfaces 1480A-1480C, 1482, and 1484 for electrical output signals and power supply signals.

FIG. 15 is a perspective diagram of a housing 1570 with electrical interfaces 1580A-1580C, 1582, 1584, and 1586 and fluid interfaces 1552 and 1554, in accordance with some examples of this disclosure. Device 1500 may include electrically insulating covers for electrical interfaces 1580A-1580C, 1582, and 1584 to prevent accidental electrical connections with interfaces 1580A-1580C, 1582, and 1584. FIG. 15 depicts electrical interface 1586 as a DB-25 connection, but electrical interface 1586 may include any other interface connection. In some examples, electrical interface 1586 may be configured to receive control signals for the switches of device 1500. Electrical interface 1586 may be configured to communicate temperature sensing and current sensing.

Housing 1570 may be a second housing that is formed outside of a first housing, such as housing 1470 in FIG. 14. The first housing may expose the signal pins of the semiconductor modules. Housing 1570 may enclose the signal pins and a PCB that is electrically connected to the signal pins. Housing 1570 may also cover the conductive portions of electrical interfaces 1580A-1580C, 1582, and 1584.

Figure 16:
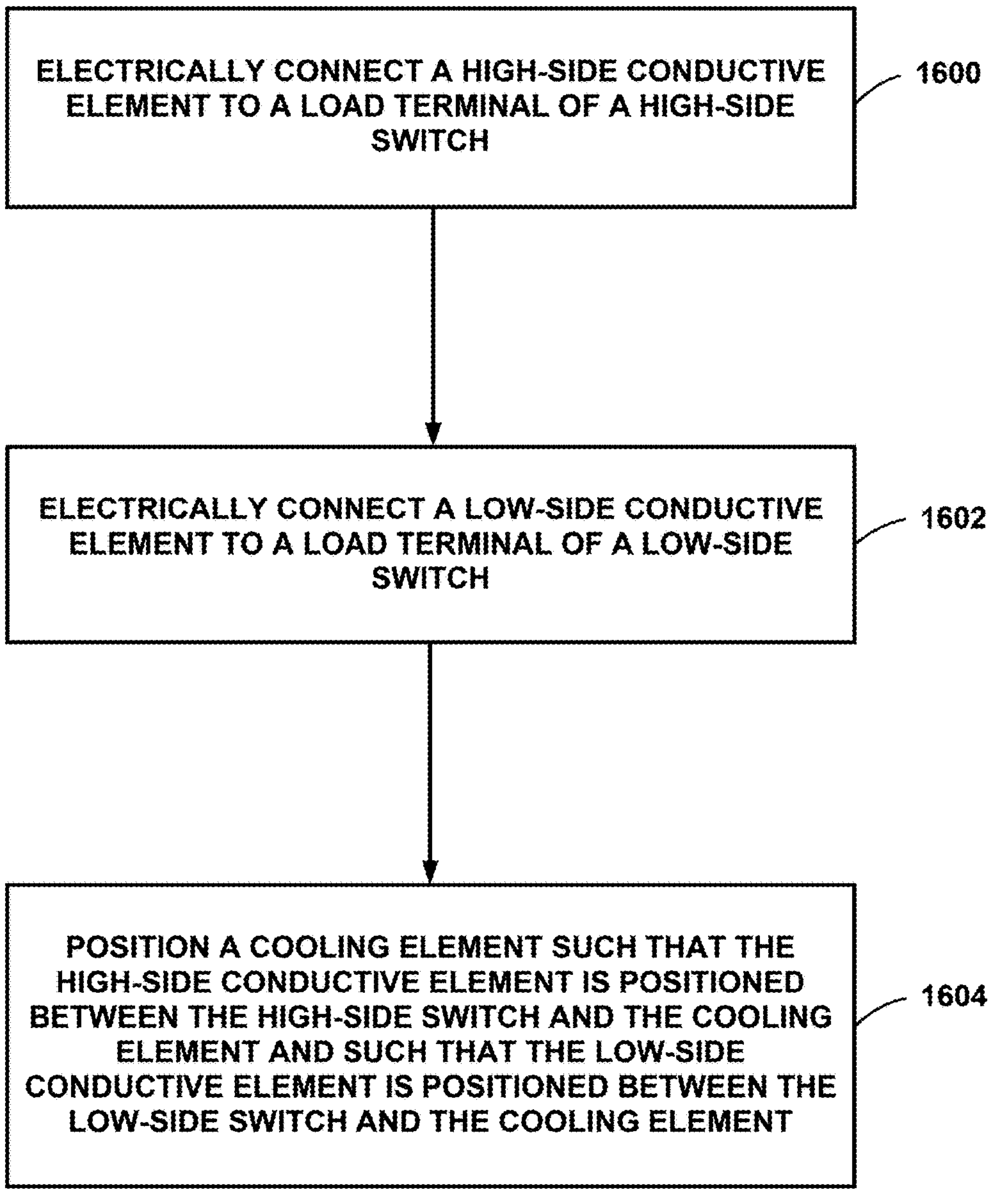
FIG. 16 is a flowchart illustrating example techniques for constructing a semiconductor module, in accordance with some examples of this disclosure.

FIG. 16 is a flowchart illustrating example techniques for constructing a semiconductor module, in accordance with some examples of this disclosure. The techniques of FIG. 16 are described with reference to device 100B in FIG. 1B, although other components, such as the devices in FIGS. 2-15, may exemplify similar techniques.

The technique of FIG. 16 includes electrically connecting high-side conductive element 120B to a first load terminal of high-side switch 110B (1600). The technique of FIG. 16 also includes electrically connecting low-side conductive element 122B to a first load terminal of low-side switch 112B (1602). The electrical connections between conductive elements 120B and 122B and switches 110B and 112B may be formed by soldering, sintering, pasting, taping, gluing, diffusion bonding, and/or thermal interface material (TIM).

The technique of FIG. 16 also includes positioning cooling element 140B such that high-side conductive element 120B is positioned between high-side switch 110B and cooling element 140B and such that low-side conductive element 122B is positioned between low-side switch 112B and cooling element 140B (1604). By positioning one of switches 110B and 112B on each side of cooling element 140B, the heat removed by cooling element 140B may be increased. Conductive elements 120B and 122B may conduct heat from switches 110B and 112B to cooling element 140B. Device 100B may include electrically insulating material between each of conductive elements 120B and 122B and cooling element 140B.

FIGS. 6A-9B and FIGS. 10A-15 illustrate two examples for constructing a device of this disclosure. In an example process using the devices depicted in FIGS. 6A-9B, switch 610 may be electrically connected to conductive element 620, signal pins 690, and diode 614. Then spacer 660 may be electrically connected to switch 610, and material 680 is formed around switch 610. As shown in FIG. 7, switches 710 and 712 may be then electrically connected to conductive elements 720 and 722, which form a C-shaped interconnect element. As shown in FIG. 8, many switches can be electrically connected to more than one C-shaped interconnect element. Power supply elements 730 and 732 can then be electrically connected to the outside load terminals of switches 710 and 712. A cooling element may then be formed inside of the C-shaped interconnect element. Material 970 may be formed around all of the components and interfaces can be formed on the surface of material 970.

In some examples, the technique of FIG. 16 includes encapsulating components 110B and 120B in a layer of cooling material and encapsulating components 112B and 122B in the layer of cooling material. The cooling material may be formed around the components of device 100B in addition to or as a substitute for positioning cooling element 140B.

FIGS. 17-20 illustrate additional example details and components of the devices of FIGS. 1A-15. For example, any of the devices can further include housing 1760 of FIG. 17, first body 1800 of FIG. 18, bodies 1900 and 1990 of FIG. 19, and/or bodies 2000 and 2090 of FIG. 20. Any of the devices can also include interconnections 1950, 1952, and 1960 and interface 1970 of FIG. 19 and/or interconnections 2050 and 2060 and signal port 2070 of FIG. 20.

Figure 17:
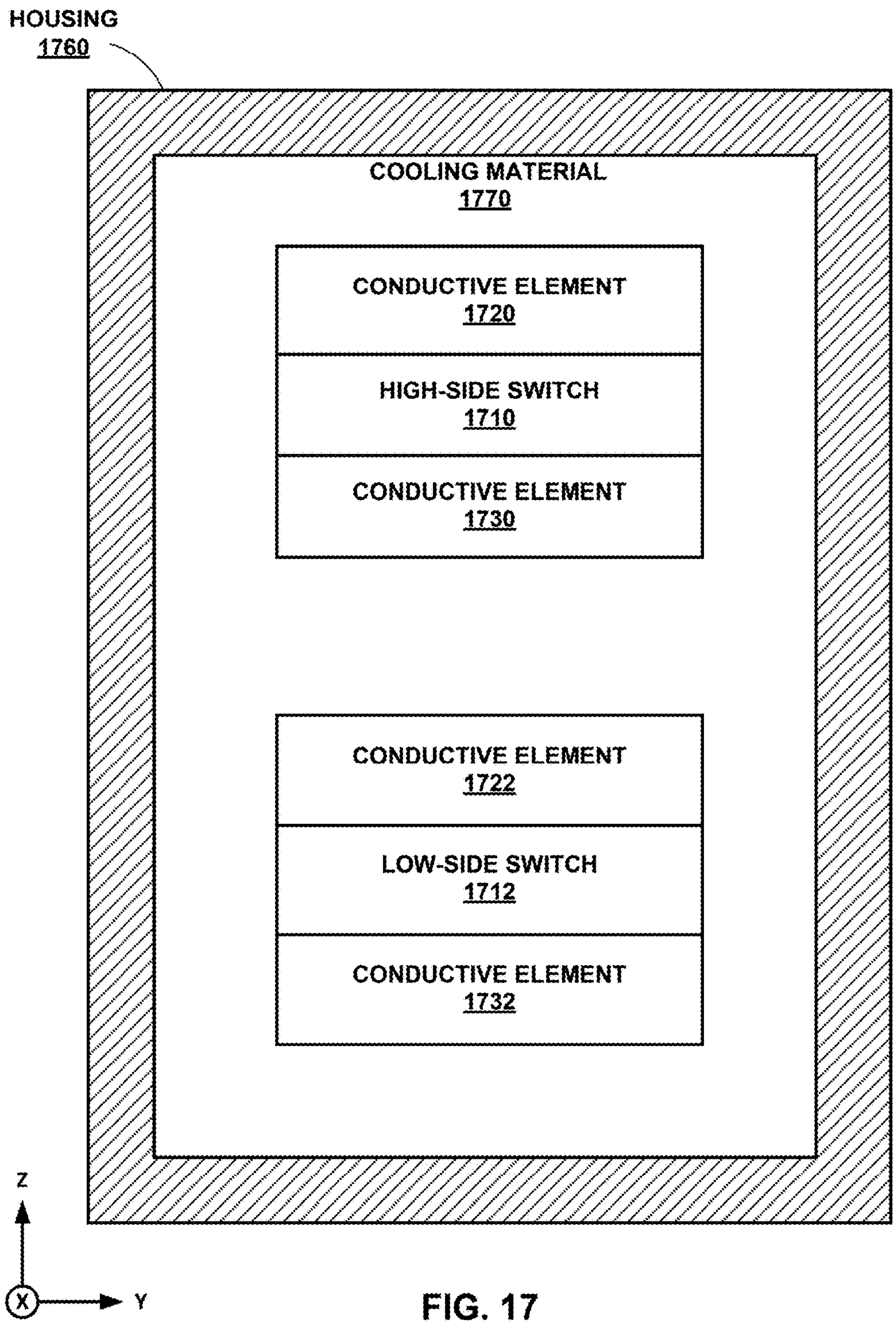
FIG. 17 is a conceptual block diagram illustrating two switches encapsulated in cooling material that is surrounded by a housing, in accordance with some examples of this disclosure.

FIG. 17 is a conceptual block diagram illustrating two switches 1710 and 1712 encapsulated in cooling material 1770 that is surrounded by a housing 1760, in accordance with some examples of this disclosure. Housing 1760 may serve to provide additional electrical isolation for the components encapsulated by cooling material 1770. Housing 1760 can include material that is thermally conductive to allow heat to transfer from cooling material 1770 to the external environment. One example of cooling material 1770 is Novec® manufactured by 3M, Inc. of Maplewood, Minn.

Figure 18:
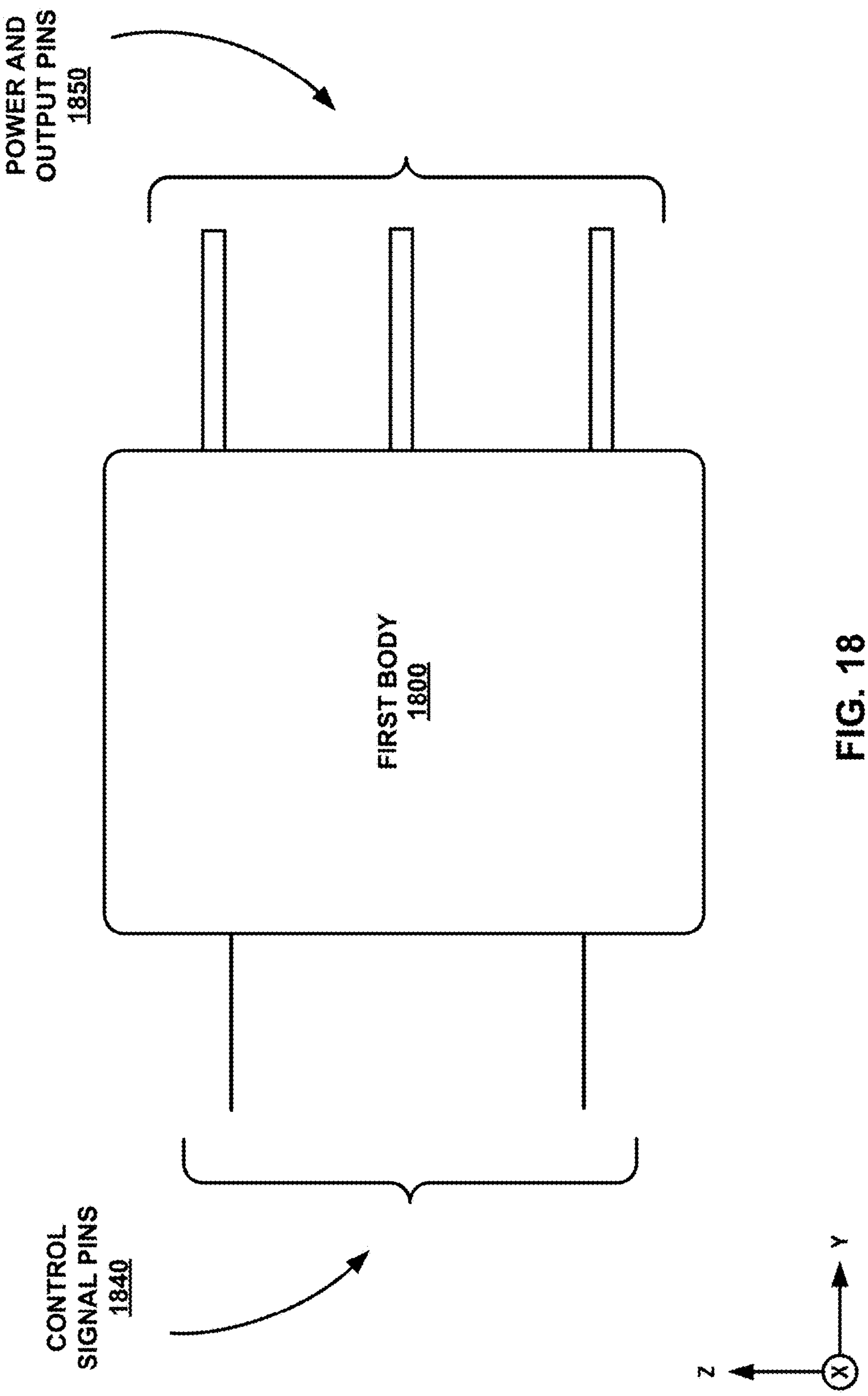
FIG. 18 is a conceptual block diagram illustrating a first body with control signal pins, power pins, and output pins extending out of the first body, in accordance with some examples of this disclosure.

FIG. 18 is a conceptual block diagram illustrating a first body 1800 with control signal pins 1840, power pins, and output pins 1850 extending out of the first body 1800, in accordance with some examples of this disclosure. The exterior of first body 1800 may be composed of cooling material with pins 1840 and 1850 extending out for electrical connections. Pins 1840 can be electrically connected to the control terminals of switches in first body 1800. Pins 1850 can be electrically connected, via conductive elements, to the load terminals of the switches.

Figure 19:
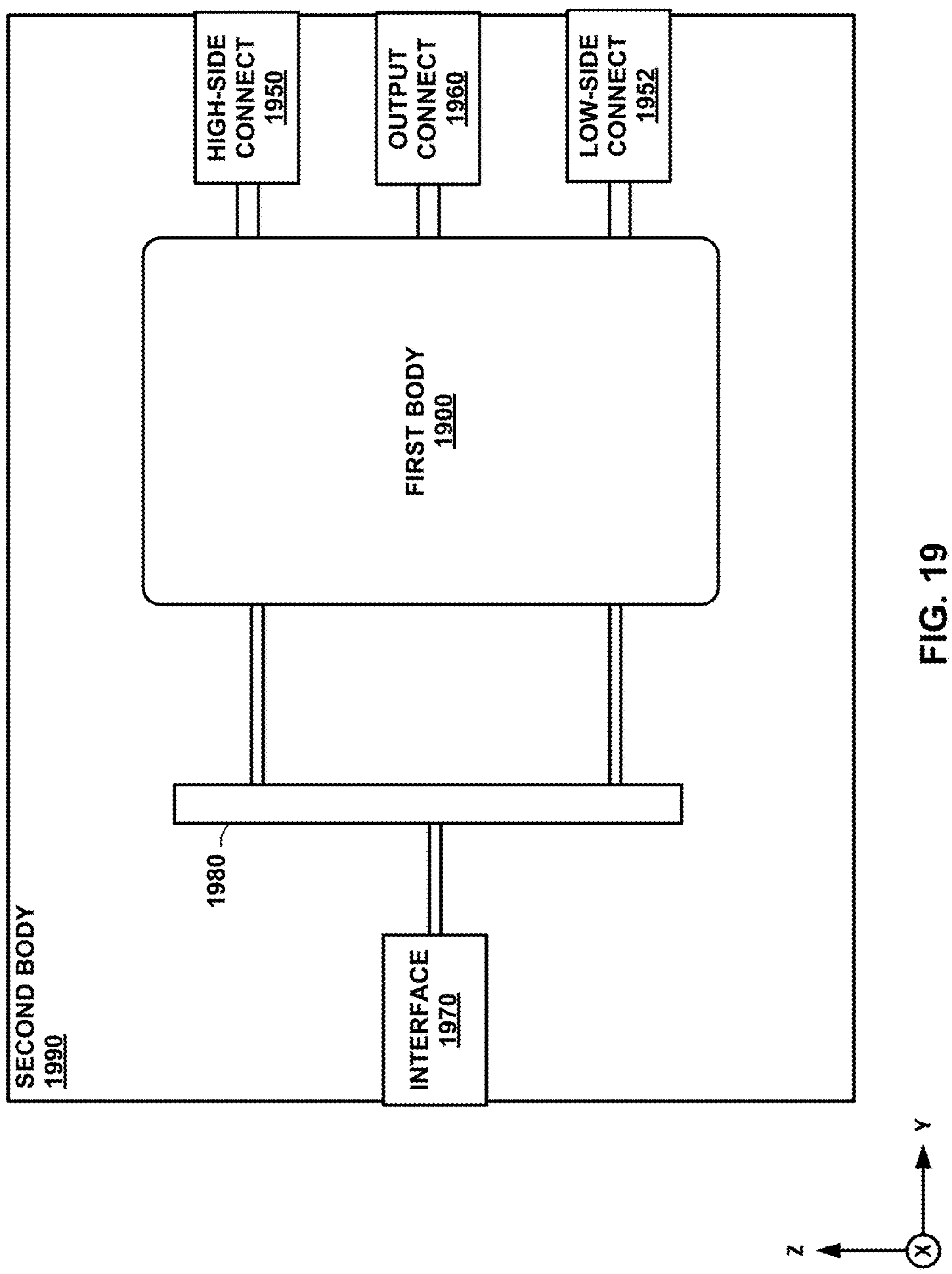
FIG. 19 is a conceptual block diagram illustrating a second body encapsulating a first body with interconnects and an interface extending out of the second body, in accordance with some examples of this disclosure.
Figure 20:
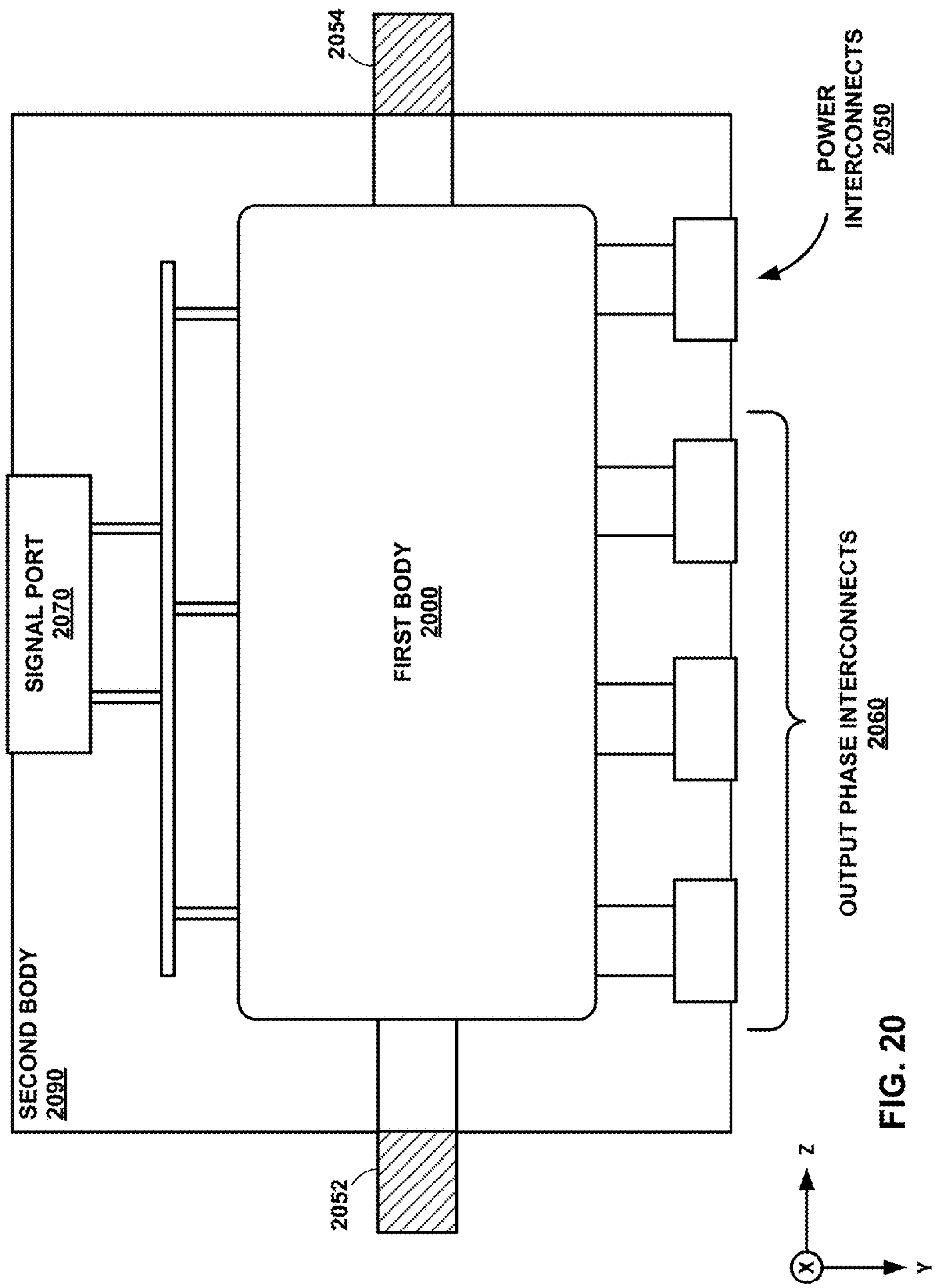
FIG. 20 is a conceptual block diagram illustrating a second body encapsulating a first body with interconnects, a signal port, and fluid interfaces extending out of the second body, in accordance with some examples of this disclosure.

FIG. 19 is a conceptual block diagram illustrating a second body 1990 encapsulating a first body 1900 with interconnects 1950, 1952, and 1960 and an interface 1970 extending out of the second body 1990, in accordance with some examples of this disclosure. Each of interconnects 1950, 1952, and 1960 may include a screwing hole. FIG. 20 is a conceptual block diagram illustrating a second body 2090 encapsulating a first body 2000 with interconnects 2050 and 2060, a signal port 2070, and fluid interfaces 2052 and 2054 extending out of the second body 2090, in accordance with some examples of this disclosure. Each of interconnects 2060 may be electrically connected to three output nodes, where each output node represents a phase of a multiphase power converter (e.g., electrical interfaces 1480A-1480C of FIG. 14A).

The following numbered examples demonstrate one or more aspects of the disclosure.

Example 1

A device includes a high-side switch, a first high-side conductive element electrically connected to a first load terminal of the high-side switch, and a second high-side conductive element electrically connected to a second load terminal of the high-side switch. The device also includes a layer of cooling material encapsulating the high-side switch, the first high-side conductive element, and the second high-side conductive element. The device further includes a low-side switch, a first low-side conductive element electrically connected to a first load terminal of the low-side switch, and a second low-side conductive element electrically connected to a second load terminal of the low-side switch. The layer of cooling material encapsulates the low-side switch, the first low-side conductive element, and the second low-side conductive element.

Example 2

The device of example 1, wherein the first high-side conductive element is positioned on a side of the high-side switch facing the low-side switch, and the first low-side conductive element is positioned on a side of the low-side switch facing the high-side switch. The first high-side conductive element is electrically connected to a high-side power supply, and the first low-side conductive element is electrically connected to a low-side power supply. The second high-side conductive element is electrically connected to the second low-side conductive element to form a C-shaped interconnect element Example 3

The device of examples 1-2 or any combination thereof, further including a first body including the cooling material, the high-side switch, the first high-side conductive element, the second high-side conductive element, the low-side switch, the first low-side conductive element, and the second low-side conductive element. The device also includes a second body surrounding the first body, the second body including interconnect elements configured to receive a high-side power supply, receive a low-side power supply, and deliver an output signal.

Example 4

The device of examples 1-3 or any combination thereof, wherein the second body further includes a PCB including an electrical interface that is at least partially exposed on the second body, wherein the PCB is configured to deliver control signals to the high-side switch and the low-side switch based on signals received at the electrical interface.

Example 5

The device of examples 1-4 or any combination thereof, wherein the cooling material includes thermoplastic material.

Example 6

The device of examples 1-5 or any combination thereof, wherein the first high-side conductive element is positioned on a side of the high-side switch facing the low-side switch, and the first low-side conductive element is positioned on a side of the low-side switch facing the high-side switch. The layer of cooling material separates the first low-side conductive element and the first high-side conductive element by a distance of less than one millimeter.

Example 7

A device includes a cooling element, a high-side switch, and a high-side conductive element electrically connected to a load terminal of the high-side switch, wherein the high-side conductive element is positioned between the high-side switch and the cooling element. The device also includes a low-side switch and a low-side conductive element electrically connected to a load terminal of the low-side switch, wherein the low-side conductive element is positioned between the low-side switch and the cooling element.

Example 8

The device of example 7, wherein the cooling element is a middle cooling element, wherein the high-side conductive element is a middle high-side conductive element, wherein the low-side conductive element is a middle low-side conductive element. The device further includes a high-side cooling element, an outside high-side conductive element positioned between the high-side switch and the high-side cooling element, a low-side cooling element, and an outside low-side conductive element positioned between the low-side switch and the low-side cooling element.

Example 9

The device of examples 7-8 or any combination thereof, wherein the middle high-side conductive element is electrically connected to the middle low-side conductive element to form a C-shaped interconnect element. The outside high-side conductive element is electrically connected to a high-side power supply, and the outside low-side conductive element is electrically connected to a low-side power supply.

Example 10

The device of examples 7-9 or any combination thereof, wherein the outside high-side conductive element is electrically connected to the outside low-side conductive element to form a C-shaped interconnected element. The middle high-side conductive element is electrically connected to a high-side power supply, and the middle low-side conductive element is electrically connected to a low-side power supply.

Example 11

The device of examples 7-10 or any combination thereof, wherein the high-side switch, the low-side switch, and the C-shaped interconnect element comprise a first phase segment. The device further includes a second phase segment including a second high-side switch, a second low-side switch, and a second C-shaped interconnect element including a second outside high-side conductive element electrically connected to a first load terminal of the second high-side switch and positioned between the second high-side switch and the high-side cooling element. The second C-shaped interconnect element also includes a second outside low-side conductive element electrically connected to a first load terminal of the second low-side switch and positioned between the second low-side switch and the low-side cooling element. The middle high-side conductive element is electrically connected to a second load terminal of the second high-side switch and positioned between the second high-side switch and the middle cooling element, and the middle low-side conductive element is electrically connected to a second load terminal of the second low-side switch and positioned between the second low-side switch and the middle cooling element.

Example 12

The device of examples 7-11 or any combination thereof, further including a thermosetting polymer material, wherein the high-side switch is encapsulated in the thermosetting polymer material, and the low-side switch is encapsulated in the thermosetting polymer material.

Example 13

The device of examples 7-12 or any combination thereof, further comprising a thermoplastic material, wherein the thermoplastic material encapsulates the cooling element, the high-side conductive element, and the low-side conductive element, and the thermoplastic material at least partially encapsulates the device.

Example 14

The device of examples 7-13 or any combination thereof, wherein the cooling element is separated from the high-side conductive element by the thermoplastic material such that the cooling element is not in direct contact with the high-side conductive element. The cooling element is separated from the low-side conductive element by the thermoplastic material such that the cooling element is not in direct contact with the low-side conductive element.

Example 15

The device of examples 7-14 or any combination thereof, wherein a distance through the thermoplastic material between the cooling element and the high-side conductive element is in a range from two hundred micrometers to one millimeter. A distance through the thermoplastic material between the cooling element and the low-side conductive element is in a range from two hundred micrometers to one millimeter.

Example 16

The device of examples 7-15 or any combination thereof, further including a PCB including an electrical interface, wherein the PCB is configured to deliver control signals to the high-side switch and deliver control signals to the low-side switch. The thermoplastic material partially encapsulates the PCB such that the thermoplastic material does not cover the electrical interface.

Example 17

The device of examples 7-16 or any combination thereof, further including a first fluid interface and a second fluid interface, wherein the cooling element is configured to carry fluid from the first fluid interface through the device to the second fluid interface. The cooling element is configured to carry liquid from the first fluid interface through the device to the second fluid interface.

Example 18

A method includes electrically connecting a first high-side conductive element to a first load terminal of a high-side switch and electrically connecting a second high-side conductive element to a second load terminal of a high-side switch. The method further includes electrically connecting a first low-side conductive element to a first load terminal of a low-side switch and electrically connecting a second low-side conductive element to a second load terminal of a low-side switch. The method also includes encapsulating the high-side switch, the first high-side conductive element, and the second high-side conductive element in a layer of cooling material and encapsulating the low-side switch, the first low-side conductive element, and the first high-side conductive element in the layer of cooling material.

Example 19

The method of example 18, positioning a cooling element such that the first high-side conductive element is positioned between the high-side switch and the cooling element and such that the first low-side conductive element is positioned between the low-side switch and the cooling element. The method further includes encapsulating the cooling element in the layer of cooling material.

Example 20

The method of example 19, wherein positioning the cooling element comprises positioning the cooling element such that the cooling element is not in direct contact with the high-side conductive element and such that cooling element is not in direct contact with the low-side conductive element.

Example 21

A device includes a high-side cooling element, a middle cooling element, and a low-side cooling element. The device further includes a high-side switch, a middle high-side conductive element electrically connected to a first load terminal of the high-side switch, wherein the middle high-side conductive element is positioned between the high-side switch and the middle cooling element, and an outside high-side conductive element electrically connected to a second load terminal of the high-side switch, wherein the outside high-side conductive element is positioned between the high-side switch and the high-side cooling element. The device also includes a low-side switch, a middle low-side conductive element electrically connected to a load terminal of the low-side switch, wherein the middle low-side conductive element is positioned between the low-side switch and the middle cooling element, and an outside low-side conductive element electrically connected to a second load terminal of the low-side switch, wherein the outside low-side conductive element is positioned between the low-side switch and the low-side cooling element. The device includes a thermoplastic material that encapsulates the high-side cooling element, the middle cooling element, the low-side cooling element, the high-side switch, the low-side switch, the middle high-side conductive element, outside high-side conductive element, the middle low-side conductive element, and the outside low-side conductive element.

Various examples of the disclosure have been described. Any combination of the described systems, operations, or functions is contemplated. These and other examples are within the scope of the following claims.

What is claimed is:

1. A device comprising:

a high-side switch;

a first high-side conductive element electrically connected to a first load terminal of the high-side switch;

a second high-side conductive element electrically connected to a second load terminal of the high-side switch;

a layer of cooling material encapsulating the high-side switch, the first high-side conductive element, and the second high-side conductive element;

a low-side switch;

a first low-side conductive element electrically connected to a first load terminal of the low-side switch;

a second low-side conductive element electrically connected to a second load terminal of the low-side switch, wherein the layer of cooling material encapsulates the low-side switch, the first low-side conductive element, and the second low-side conductive element;

a printed circuit board (PCB) including an electrical interface and configured to:

deliver control signals to the high-side switch based on signals received at the electrical interface; and deliver control signals to the low-side switch based on signals received at the electrical interface;

a first body including the cooling material, the high-side switch, the first high-side conductive element, the second high-side conductive element, the low-side switch, the first low-side conductive element, and the second low-side conductive element; and a second body surrounding the first body, the second body including the PCB and interconnect elements configured to receive a high-side power supply, receive a low-side power supply, and deliver an output signal, wherein the electrical interface is at least partially exposed on the second body.

2. The device of claim 1, wherein the first high-side conductive element is positioned on a side of the high-side switch facing the low-side switch, wherein the first low-side conductive element is positioned on a side of the low-side switch facing the high-side switch, wherein the first high-side conductive element is electrically connected to a high-side power supply, wherein the first low-side conductive element is electrically connected to a low-side power supply, and wherein the second high-side conductive element is electrically connected to the second low-side conductive element to form a C-shaped interconnect element.

3. The device of claim 1, wherein the cooling material includes thermoplastic material.

4. The device of claim 1, wherein the first high-side conductive element is positioned on a side of the high-side switch facing the low-side switch, wherein the first low-side conductive element is positioned on a side of the low-side switch facing the high-side switch, and wherein the layer of cooling material separates the first low-side conductive element and the first high-side conductive element by a distance of less than one millimeter.

5. The device of claim 1, wherein the first high-side conductive element is positioned on a side of the high-side switch facing the low-side switch, wherein the first low-side conductive element is positioned on a side of the low-side switch facing the high-side switch, and wherein the first high-side conductive element is electrically connected to the first low-side conductive element to form a C-shaped interconnect element.

6. A device comprising:

a middle cooling element;

a high-side cooling element;

a high-side switch;

an outside high-side conductive element positioned between the high-side switch and the high-side cooling element, wherein the outside high-side conductive element is electrically connected to a high-side power supply;

a middle high-side conductive element electrically connected to a load terminal of the high-side switch, wherein the middle high-side conductive element is positioned between the high-side switch and the middle cooling element;

a low-side cooling element;

a low-side switch;

an outside low-side conductive element positioned between the low-side switch and the low-side cooling element, wherein the outside low-side conductive element is electrically connected to a low-side power supply; and a middle low-side conductive element electrically connected to a load terminal of the low-side switch, wherein the middle low-side conductive element is positioned between the low-side switch and the middle cooling element, and wherein the middle high-side conductive element is electrically connected to the middle low-side conductive element to form a C-shaped interconnect element.

7. The device of claim 6, wherein the high-side switch, the low-side switch, and the C-shaped interconnect element comprise a first phase segment, the device further comprising a second phase segment comprising:

a second high-side switch;

a second low-side switch; and a second C-shaped interconnect element including:

a second middle high-side conductive element electrically connected to a first load terminal of the second high-side switch and positioned between the second high-side switch and the middle cooling element; and a second middle low-side conductive element electrically connected to a first load terminal of the second low-side switch and positioned between the second low-side switch and the middle cooling element, wherein the outside high-side conductive element is electrically connected to a second load terminal of the second high-side switch and positioned between the second high-side switch and the high-side cooling element, and wherein the outside low-side conductive element is electrically connected to a second load terminal of the second low-side switch and positioned between the second low-side switch and the low-side cooling element.

8. The device of claim 6, further comprising a thermosetting polymer material, wherein the high-side switch is encapsulated in the thermosetting polymer material, and wherein the low-side switch is encapsulated in the thermosetting polymer material.

9. The device of claim 6, further comprising a thermoplastic material, wherein the thermoplastic material encapsulates the middle cooling element, the middle high-side conductive element, and the middle low-side conductive element, and wherein the thermoplastic material at least partially encapsulates the device.

10. The device of claim 9, wherein the middle cooling element is separated from the middle high-side conductive element by the thermoplastic material such that the middle cooling element is not in direct contact with the middle high-side conductive element, and wherein the middle cooling element is separated from the middle low-side conductive element by the thermoplastic material such that the middle cooling element is not in direct contact with the middle low-side conductive element.

11. The device of claim 10, wherein a distance through the thermoplastic material between the middle cooling element and the middle high-side conductive element is in a range from two hundred micrometers to one millimeter, and wherein a distance through the thermoplastic material between the middle cooling element and the middle low-side conductive element is in a range from two hundred micrometers to one millimeter.

12. The device of claim 9, further comprising a printed circuit board (PCB) including an electrical interface, wherein the PCB is configured to:

deliver control signals to the high-side switch; and deliver control signals to the low-side switch, and wherein the thermoplastic material partially encapsulates the PCB such that the thermoplastic material does not cover the electrical interface.

13. The device of claim 6, further comprising a first fluid interface and a second fluid interface, wherein the middle cooling element is configured to carry fluid from the first fluid interface through the device to the second fluid interface.

14. A method comprising:

electrically connecting a first high-side conductive element to a first load terminal of a high-side switch;

electrically connecting a second high-side conductive element to a second load terminal of a high-side switch;

electrically connecting a first low-side conductive element to a first load terminal of a low-side switch;

electrically connecting a second low-side conductive element to a second load terminal of a low-side switch;

encapsulating the high-side switch, the first high-side conductive element, and the second high-side conductive element in a layer of cooling material;

encapsulating the low-side switch, the first low-side conductive element, and the first high-side conductive element in the layer of cooling material;

positioning a cooling element such that the first high-side conductive element is positioned between the high-side switch and the cooling element and such that the first low-side conductive element is positioned between the low-side switch and the cooling element, wherein positioning the cooling element comprises positioning the cooling element such that the cooling element is not in direct contact with the first high-side conductive element and such that cooling element is not in direct contact with the first low-side conductive element; and encapsulating the cooling element in the layer of cooling material.

15. A device comprising:

a middle cooling element;

a high-side cooling element;

a high-side switch;

an outside high-side conductive element positioned between the high-side switch and the high-side cooling element;

a middle high-side conductive element electrically connected to a high-side power supply and to a load terminal of the high-side switch, wherein the middle high-side conductive element is positioned between the high-side switch and the middle cooling element;

a low-side cooling element;

a low-side switch;

an outside low-side conductive element positioned between the low-side switch and the low-side cooling element; and a middle low-side conductive element electrically connected to a low-side power supply and to a load terminal of the low-side switch, wherein the middle low-side conductive element is positioned between the low-side switch and the middle cooling element, and wherein the outside high-side conductive element is electrically connected to the outside low-side conductive element to form a C-shaped interconnect element.

16. The device of claim 15, wherein the high-side switch, the low-side switch, and the C-shaped interconnect element comprise a first phase segment, the device further comprising a second phase segment comprising:

a second high-side switch;

a second low-side switch; and a second C-shaped interconnect element including:

a second outside high-side conductive element electrically connected to a first load terminal of the second high-side switch and positioned between the second high-side switch and the high-side cooling element; and a second outside low-side conductive element electrically connected to a first load terminal of the second low-side switch and positioned between the second low-side switch and the low-side cooling element, wherein the middle high-side conductive element is electrically connected to a second load terminal of the second high-side switch and positioned between the second high-side switch and the middle cooling element, and wherein the middle low-side conductive element is electrically connected to a second load terminal of the second low-side switch and positioned between the second low-side switch and the middle cooling element.

17. The device of claim 15, further comprising a thermoplastic material at least partially encapsulating the device, wherein the thermoplastic material encapsulates the middle cooling element, the middle high-side conductive element, and the middle low-side conductive element, wherein the middle cooling element is separated from the middle high-side conductive element by the thermoplastic material such that the middle cooling element is not in direct contact with the middle high-side conductive element, and wherein the middle cooling element is separated from the middle low-side conductive element by the thermoplastic material such that the middle cooling element is not in direct contact with the middle low-side conductive element.

18. The device of claim 15, further comprising:

a printed circuit board (PCB) including an electrical interface and configured to deliver control signals to the high-side switch and to the low-side switch; and a thermoplastic material partially encapsulating the PCB such that the thermoplastic material does not cover the electrical interface, wherein the thermoplastic material encapsulates the middle cooling element, the middle high-side conductive element, and the middle low-side conductive element.

19. A device comprising:

a cooling element;

a high-side switch;

a high-side conductive element electrically connected to a load terminal of the high-side switch, wherein the high-side conductive element is positioned between the high-side switch and the cooling element;

a low-side switch;

a low-side conductive element electrically connected to a load terminal of the low-side switch, wherein the low-side conductive element is positioned between the low-side switch and the cooling element; and a thermoplastic material encapsulating the cooling element, the high-side conductive element, and the low-side conductive element, wherein the cooling element is separated from the high-side conductive element by the thermoplastic material such that the cooling element is not in direct contact with the high-side conductive element, wherein the cooling element is separated from the low-side conductive element by the thermoplastic material such that the cooling element is not in direct contact with the low-side conductive element, and wherein the thermoplastic material at least partially encapsulates the device.

20. A device comprising:

a cooling element;

a high-side switch;

a high-side conductive element electrically connected to a load terminal of the high-side switch, wherein the high-side conductive element is positioned between the high-side switch and the cooling element;

a low-side switch;

a low-side conductive element electrically connected to a load terminal of the low-side switch, wherein the low-side conductive element is positioned between the low-side switch and the cooling element;

a printed circuit board (PCB) including an electrical interface and configured to:

deliver control signals to the high-side switch; and deliver control signals to the low-side switch; and a thermoplastic material encapsulating the cooling element, the high-side conductive element, and the low-side conductive element, wherein the thermoplastic material partially encapsulates the PCB such that the thermoplastic material does not cover the electrical interface, and wherein the thermoplastic material at least partially encapsulates the device.

* * * * *